(12) United States Patent
Kobayashi

(10) Patent No.: US 7,348,207 B2
(45) Date of Patent: Mar. 25, 2008

(54) METHOD OF MANUFACTURING ORGANIC EL DEVICE, ORGANIC EL DEVICE, AND ELECTRONIC APPARATUS

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 18 days.

(21) Appl. No.: 10/969,049

(22) Filed: Oct. 21, 2004

(65) Prior Publication Data

US 2005/0121669 A1  Jun. 9, 2005

(30) Foreign Application Priority Data

| Oct. 23, 2003 | (JP) | ............................. 2003-363434 |
| Sep. 10, 2004 | (JP) | ............................. 2004-263360 |

(51) Int. Cl.
*H01L 29/24* (2006.01)
*G02F 1/1335* (2006.01)

(52) U.S. Cl. .................... 438/99; 257/40; 257/103; 257/E51.022; 438/35; 349/69; 349/80

(58) Field of Classification Search ................ 438/99, 438/28–29, 34–35, 82; 257/E51.022, 40, 257/103; 349/69, 77–80, 106
See application file for complete search history.

(56) References Cited

U.S. PATENT DOCUMENTS

| 5,909,081 | A  | * | 6/1999  | Eida et al. ................. 313/504 |
| 6,309,486 | B1 | * | 10/2001 | Kawaguchi et al. .......... 156/67 |
| 6,392,340 | B2 | * | 5/2002  | Yoneda et al. .............. 313/506 |
| 6,563,263 | B1 | * | 5/2003  | Kawaguchi et al. ........ 313/509 |
| 6,633,121 | B2 | * | 10/2003 | Eida et al. .................. 313/504 |
| 6,781,162 | B2 |   | 8/2004  | Yamazaki et al. |
| 6,851,364 | B1 | * | 2/2005  | Suda ......................... 101/456 |
| 6,965,195 | B2 |   | 11/2005 | Yamazaki et al. |
| 2002/0011783 | A1 | * | 1/2002  | Hosokawa .................. 313/504 |
| 2002/0021087 | A1 | * | 2/2002  | Eida et al. .................. 313/504 |
| 2002/0024051 | A1 | * | 2/2002  | Yamazaki et al. ............ 257/79 |
| 2002/0057051 | A1 | * | 5/2002  | Kobayashi .................. 313/504 |
| 2002/0063517 | A1 | * | 5/2002  | Hosokawa .................. 313/504 |
| 2002/0113241 | A1 | * | 8/2002  | Kubota et al. ................ 257/79 |
| 2002/0192576 | A1 | * | 12/2002 | Matsuoka et al. ............. 430/7 |
| 2003/0072890 | A1 |   | 4/2003  | Miyazawa |
| 2003/0214620 | A1 | * | 11/2003 | Kim et al. .................. 349/155 |
| 2003/0230972 | A1 | * | 12/2003 | Cok ........................... 313/504 |
| 2004/0012020 | A1 | * | 1/2004  | Gaudiana et al. ............ 257/51 |
| 2004/0046184 | A1 | * | 3/2004  | Yanagawa et al. .......... 257/200 |
| 2004/0072380 | A1 | * | 4/2004  | Yamazaki et al. ............ 438/30 |

(Continued)

FOREIGN PATENT DOCUMENTS

| EP |    1061383 A1 | * | 12/2000 |
| JP |   A-07-220871 |   | 8/1995  |
| JP |    10012377 A | * | 1/1998  |
| JP |  A-2000-200061 |   | 7/2000  |
| JP |   A-2001-93661 |   | 4/2001  |

(Continued)

*Primary Examiner*—B. William Baumeister
*Assistant Examiner*—Matthew W. Such
(74) *Attorney, Agent, or Firm*—Oliff & Berridge, PLC

(57) ABSTRACT

A method of manufacturing an organic EL device that is capable of reducing the manufacturing cost by effectively using the material is provided. In the method of manufacturing the organic EL device including a white-light-emitting layer and a color filter, the white-light-emitting layer is formed by using a liquid droplet ejection method. Further, the color filters are also formed by using the liquid droplet ejection method. As a result, it is possible to reduce waste of the material and the manufacturing time.

2 Claims, 19 Drawing Sheets

U.S. PATENT DOCUMENTS

| | | | |
|---|---|---|---|
| 2004/0077113 A1* | 4/2004 | Yamazaki et al. | 438/29 |
| 2004/0113550 A1* | 6/2004 | Adachi et al. | 313/512 |
| 2004/0113875 A1* | 6/2004 | Miller et al. | 345/82 |
| 2004/0166362 A1* | 8/2004 | Utsumi et al. | 428/690 |
| 2005/0040756 A1* | 2/2005 | Winters et al. | 313/504 |
| 2005/0062903 A1* | 3/2005 | Cok et al. | 349/69 |
| 2005/0100660 A1* | 5/2005 | Ito et al. | 427/66 |
| 2005/0146266 A1* | 7/2005 | Kuma et al. | 313/506 |

FOREIGN PATENT DOCUMENTS

| | | |
|---|---|---|
| JP | A-2002-06129 | 1/2002 |
| JP | A-2002-035684 | 2/2002 |
| JP | A-2003-36974 | 2/2003 |
| JP | A-2003-124213 | 4/2003 |
| JP | A-2003-288994 | 10/2003 |
| KR | 2002-48420 A | 6/2002 |
| WO | WO 0046037 A1 * | 8/2000 |
| WO | WO 01/58221 A1 | 8/2001 |
| WO | WO 03/069957 A1 | 8/2003 |
| WO | WO 03069957 A1 * | 8/2003 |

* cited by examiner

METHOD OF MANUFACTURING ORGANIC EL DEVICE, ORGANIC EL DEVICE, AND ELECTRONIC APPARATUS

BACKGROUND OF THE INVENTION

1. Field of Invention

The present invention relates to a method of manufacturing an organic EL device, to an organic EL device, and to an electronic apparatus comprising the same.

2. Description of Related Art

A technique which combines a white-light-emitting layer and a color filter as an organic electroluminescent device (hereinafter, referred to as an organic EL device) capable of performing full color display is known (for example, see Japanese Unexamined Patent Application Publication No. 10-125474). In the above organic EL device, since the light-emitting duration of R, G, and B pixels is the same, it is possible to satisfactorily maintain the color balance even when it is used for an extended period of time.

However, since the conventional white-light-emitting layer is made of a low-molecular-weight light-emitting material, the layer is typically made by using an evaporation method, which cannot effectively utilize the materials used in the manufacturing process.

SUMMARY OF THE INVENTION

The present invention is made in consideration of the above problems, and it is an object of the present invention to provide a method of manufacturing an organic EL device, an organic EL device, and an electronic apparatus comprising the same in which the manufacturing cost can be reduced by effectively utilizing the materials used in the manufacturing process.

In order to solve the above-mentioned problems, the method of manufacturing an organic EL device according to the present invention is a method of manufacturing an organic EL device including a white-light-emitting layer and a color filter, wherein the white-light-emitting layer is formed by using a liquid droplet ejection method.

In this method, since the light-emitting material is selectively provided only on a required region by using the liquid droplet ejection method, it is possible to effectively utilize the expensive light-emitting material. In order to use the liquid droplet ejection method in this manufacturing method, the white-light-emitting layer is preferably made of a high molecular material. The 'high molecule' refers to a polymer whose molecular weight is larger than that of the 'low molecule' having several hundreds of molecular weight. The above high molecular material includes a low molecular weight polymer, referred to as oligomer, having molecular weight of 10000 or less in addition to the polymer having molecular weight of 10000 or more which is generally referred to high molecular.

However, in the above method, the white-light-emitting layer and the color filter are preferably formed by using the liquid droplet ejection method. In this case, even though the method of forming the white-light-emitting layer or the color filter is determined depending on which the organic EL device has a bottom-emission-type structure or a top-emission-type structure, the following methods are considered as the method.

(1) A method including a step of forming the color filter layer on a substrate by using the liquid droplet ejection method and a step of forming the white-light-emitting layer above the color filter formed on the substrate by using the liquid droplet ejection method.

(2) A method including a step of forming the white-light-emitting layer on a substrate by using the liquid droplet ejection method and a step of forming the color filter above the white-light-emitting layer formed on the substrate by using the liquid droplet ejection method.

(3) A method including a step of forming the white-light-emitting layer on a substrate by using the liquid droplet ejection method, a step of forming the color filter on another substrate by using the liquid droplet ejection method, and a step of bonding both the substrates.

The above method (1) is a method when the organic EL device has the bottom-emission-type structure, and the methods (2) and (3) are a method when the organic EL device has the top-emission-type structure.

In the above methods (1) and (2), since the white-light-emitting layer and the color filter are sequentially formed on the same substrate, it is different from the method (3) in which the white-light-emitting layer and the color filter are formed on different substrates to bond both the substrates. The method (1) and (2) does not need for alignment, therefore, it is possible to obtain a high precision. In contrary, in the method (3), since the white-light-emitting layer and the color filters are separately formed on different substrates, this method has an advantage in yield, in spite of disadvantage in precision, compared to the methods (1) and (2).

When the color filter is formed on the white-light-emitting layer, like as the method (2), so as not to deteriorate the white-light-emitting layer on the base, a protective film may be formed between the white-light-emitting layer and the color filter.

In the above method (2), it is preferable that before the color filter forming step, a lyophobic portion be patterned on a surface of the protective layer, and in the color filter forming step, a liquid material including a material for forming the color filter is ejected into a portion other than the lyophobic portion by using the liquid droplet ejection method. In this regard, the lyophobic portion patterning step comprises a step of performing a plasma treatment using a fluorine-containing gas on the surface of the protective film and a step of selectively irradiating ultraviolet rays onto a region of the protective film on which the color filter is formed and the plasma treatment is performed. Generally, when forming the color filter, a bank layer is formed by photolithography, and then a material for forming the color filter is arranged in a region surrounded by the bank layer. However, if the above method is applied to the method (2), the white-light-emitting layer on the base deteriorates due to the wet process when forming the bank layer. Therefore, by this method without using the wet process, it is possible to manufacture the organic EL device having a high reliability. In addition, since an ultraviolet absorber is mixed in the protective layer formed on a cathode to give a lyophilic property, it is further possible to protect the light-emitting layer from the ultraviolet rays.

Further, an organic EL device manufacturing method of the present invention is a method of manufacturing an organic EL device including a white-light-emitting layer for emitting a white light component, a color light-emitting layer for emitting a color light component, and a color filter, the white-light-emitting layer and the color light-emitting layer are formed by using a liquid droplet ejection method. In this method, the color filter is formed at positions corresponding to the white-light-emitting layer, or the color filter is formed at positions corresponding to both the white-light-emitting layer and the color light-emitting layer.

According to the above method, since the light-emitting material is selectively provided only on a required region by using the liquid droplet ejection method, it is possible to effectively utilize the expensive light-emitting material.

According to the organic EL device manufacturing method of the present invention, it is preferable to form the color filter by using the liquid droplet ejection method.

Therefore, according to this method, it is possible to reduce waste of the color filter material and thus to reduce the device cost.

According to the organic EL device manufacturing method of the present invention, the size of the white-light-emitting layer and the size of the color light-emitting layer can be determined based on the brightness of light emitted from the color light-emitting layer and the brightness of light emitted from the white-light-emitting layer, which passes through the color filter.

Therefore, according to this method, it is possible to satisfactorily maintain the balance of a color light component which passes through the color filter and a color light which is emitted from the color light-emitting layer.

According to an organic EL device of the present invention is an organic EL device including a white-light-emitting layer and a color filter, and the white-light-emitting layer is formed in a region, which is divided by a bank layer, by using a liquid droplet ejection method. Therefore, it is possible to provide the organic EL device with an excellent display quality at a low cost. In this case, in order to use the liquid droplet ejection method, the white-light-emitting layer is preferably made of a high molecular light-emitting material.

Further, the above color filter may be formed by using the liquid droplet ejection method. Specifically, the color filter can be formed in a region which is divided by a bank layer different from the bank layer for dividing the white-light-emitting layer, by using the liquid droplet ejection method. Further, the color filter may be formed in a region (a region relatively having a lyophilic property) on a substrate with a lyophobic pattern in which a lyophobic pattern is not formed, by using the liquid droplet ejection method. By forming the color filter by using the liquid droplet ejection method, it is possible to provide the organic EL device at a low cost.

An organic EL device of the present invention is an organic EL device including a white-light-emitting layer for emitting white light, a color light-emitting layer for emitting color light components other than the white light component, and color filter, the white-light-emitting layer and the color light-emitting layer are formed in a region, which is divided by a bank layer, by using a liquid droplet ejection method. In this device, the color filter can be formed at positions corresponding to the white-light-emitting layer. Further, the color filter can be formed at positions corresponding to both the white-light-emitting layer and the color light-emitting layer. According to the above device, since the liquid droplet ejection method can be used, the white-light-emitting layer and the color light-emitting layer are preferably made of a high molecular light-emitting material.

According to the above device, it is possible to provide the organic EL device having an excellent display quality at a low cost.

According to the organic EL device of this invention, the color filter is preferably made by using the liquid droplet ejection method. Specifically, the color filter can be formed in a region which is divided by a bank layer different from the bank layer for dividing the white-light-emitting layer or the color light-emitting layer, by using the liquid droplet ejection method. Further, the color filter may be formed in a region (a region relatively having a lyophilic property) on a substrate with a lyophobic pattern in which a lyophobic pattern is not formed, by using the liquid droplet ejection method. By forming the color filter by using the liquid droplet ejection method, it is possible to provide the organic EL device at a low cost.

According to the above device, it is possible to provide the organic EL device having an excellent display quality at a low cost.

An electronic apparatus of this invention includes the organic EL device according to this invention. As a result, it is possible to provide the organic EL device with an excellent display quality at a low cost.

DETAILED DESCRIPTION OF PREFERRED EMBODIMENTS

First Embodiment

Figure 1A:
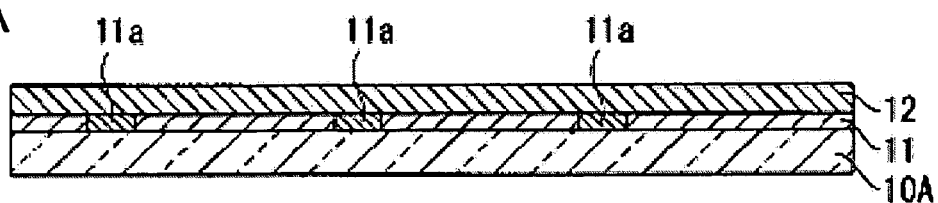
FIG. 1 is a process view showing a method of manufacturing an organic EL device according to a first embodiment.

Hereinafter, an organic EL device and a method of manufacturing the same according to the present embodiment will be described with reference to FIGS. 1 to 3. FIGS. 1 to 3 are process views showing a method of manufacturing an organic EL device according to the present embodiment. A cross-sectional structure of three pixel regions, that is, R (red), G (green), and B (blue) pixel regions are also shown in the drawings. A scale of each layer or member is adjusted in order to have a recognizable size in the drawings.

The organic EL device of the present embodiment is a full-color organic EL display device having three types of pixels, that is, R (red), G (green), and B (blue) pixels. As shown in FIG. 3(c), in the organic EL display device 100 of the present embodiment, a bank layer 16 for dividing pixels on an element substrate 10 having anodes (pixel electrodes) 15 provided thereon is provided. An electro-optical layer (light-emitting functional layer) E having a white-light-emitting material is formed in a region which is divided by the bank layer 16. Openings are formed at positions corresponding to each pixel on the bank layer 16. The above electro-optical layer E is formed at positions where the anodes 15 are exposed by the openings. Therefore, a cathode (counter electrode) 19 is provided so as to cover the bank layer 16 and the light-emitting functional layer E.

The anodes 15 and the cathode 19 are made of a conductive material like ITO. For example, in a bottom-emission-type structure, a light-transmissive conductive material such as ITO is used for the anode 15 so that the light emitted from the electro-optical layer E can be transmitted through the anode side. In addition, in order that the light emitted to the cathode can be transmitted through the anode side, the cathode 19 is preferably made of a metal material having a high reflectance, such as Al or Ag, or includes a structure in which a light-transmitting material and a metal material having a high reflectance are laminated, such as Al/ITO. In contrast, according to a top-emission-type structure that emits the emitted light at the cathode side, the cathode 19 is made of a transmissive conductive material, and the anode 15 is made of a conductive material having a high reflectance. In this regard, the cathode 19 is made of a co-deposited film of Bathocuproin (BCP) and Cesium (Cs), and is formed in a structure in which ITO is laminated thereon in order to give conductivity. Further, the cathode 19 is disposed so as to cover the bank layer 16 and an exposed surface of an electro-optical layer E to function as a common electrode for each pixel.

This embodiment introduces a bottom-emission-type structure that light radiated onto the electro-optical layer E is emitted from a substrate main body 10A (that is, by passing through the color filter layer 13). The anode 15 is made of a transmissive conductive material, such as ITO.

In the element substrate 10, a circuit element portion 11, an interlayer insulating film 12, and a color filter layer 13 are laminated, in this order, on the transmissive substrate main body 10A made of glass or resin. The above-mentioned anodes 15 are arranged in a matrix on the color filter layer 13 so as to correspond to each pixel. Various wiring lines such as scanning lines or signal lines, circuits such as storage capacitors (not shown) for storing an image signal, and TFTs 11a serving as pixel switching elements are provided in the circuit element portion 11.

Three color filters, that is, R, G, and B color filters 14R, 14G, 14B are arranged in a matrix with a shape divided by the bank layer 141, in the color filter layer 13. The bank layer 141 has openings provided in positions that overlap openings in the bank layer 16 in plan view, and each of the color filters 14R, 14G, 14B is arranged in a region divided by the bank layer 141. In addition, the color filter layer 13 refers to a layer having the color filters 14R, 14G, 14B and the bank layer 141.

The electro-optical layer E is formed by laminating a hole injecting/transporting layer 17 and a white-light-emitting layer 18 containing a white-light-emitting material in this order from the lower layer.

As a material for forming the hole injecting/transporting layer 17, for example, a high molecular material such as polythiophene, polystyrenesulfonic acid, polypyrrole, polyaniline or its derivative may be used. As the material for the white-light-emitting layer 18 (light-emitting material), a high-molecular-weight light-emitter or a low-molecular-weight organic light-emitting pigment, that is, various light-emitting substance such as a fluorescent material or a phosphorescent material may be used. Among conjugated high-molecular-weight materials for the light-emitting material, a material containing arylenevinylene or polyfluorene is particularly preferable. In this embodiment, since the white-light-emitting layer 18 is formed by using an inkjet method (a liquid droplet ejection method), the high-molecular-weight material is preferably used as the light-emitting material. For example, a material having a mixture of polydioctylfluorine (PFO) and MEH-PPV in a ratio of 9:1 is preferably used. In this embodiment, even though the electro-optical layer E has a two-layered laminated structure, an electron-transporting layer or an electron-injecting layer may be formed on the light-emitting layer 18, if necessary.

The above-mentioned substrate is sealed by a sealing material 20. The sealing material 20 preferably has a gas barrier property, for example, a silicon oxide such as $SiO_2$, a silicon nitride such as SiN, or a silicon oxynitride such as $SiO_xN_y$. In addition, a protective film may be provided between the cathode 19 and the sealing material 20, if necessary. When the interlayer insulating film 32, which is formed below the anode 15, is made of the silicon oxide, the silicon nitride, or the silicon nitride, the EL element having the anodes 15, electro-optical layer E, and the cathode 19 comprises a gas-barrier film (that is, the interlayer insulating film 12 and sealing material 20), and as a result it is possible to form the organic EL device having a high reliability.

Hereinafter, a method of manufacturing the organic EL device according to this embodiment will be described.

The method of manufacturing the organic EL device 100 according to this embodiment comprises (1) a color filter forming step, (2) an anode (pixel electrode) forming step, (3) an electro-optical layer (light-emitting functional layer) forming step, and (4) a cathode (counter electrode) forming step and a sealing step. The manufacturing method is not limited to the above embodiment, but other steps may be omitted therefrom or be added thereto, if necessary. The respective steps will be described below in detail.

(1) Color Filter Forming Step

As an initial step, as shown in FIG. 1A, a substrate main body 10A on which the circuit element portion 11 and an interlayer insulating film 12 are formed is prepared. These circuit element portion 11 and interlayer insulating film 12 may be formed by using a well-known method.

Figure 1B:
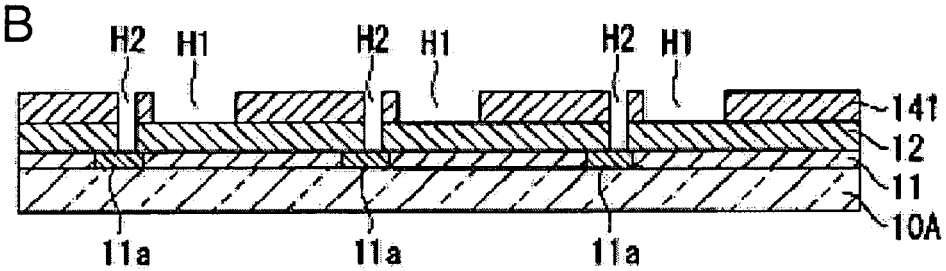
Figure 1C:
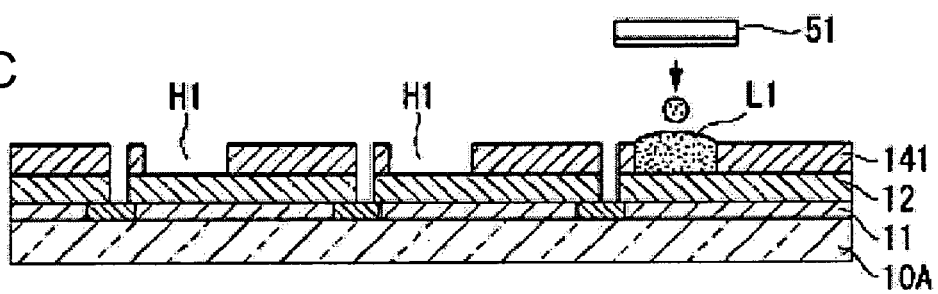

Next, as shown in FIG. 1B, bank layers 141 made of a photosensitive material are formed in a lattice at positions (non-pixel region) that enclose the respective pixels. Specifically, a photosensitive material having heat resistance and solvent resistance, such as acrylic resin or polyimide resin, is applied on the substrate, and openings H1 are formed at positions corresponding to the respective pixels by using a photolithographic method. Further, openings (contact holes) H2 which lead to TFTs 11a are formed on the bank layers 141 and the interlayer insulating film 12.

Figure 1D:
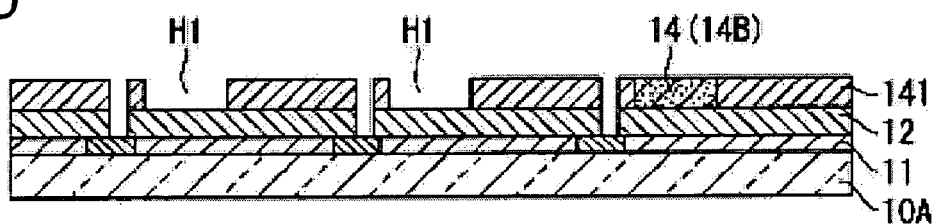

Next, color filters having colors corresponding to the respective openings H1 of the bank layers 141 are formed by using the liquid droplet ejection method. In this step, a liquid material containing a material for forming a color filter is ejected into the bank openings H1 by using an inkjet device as the liquid droplet ejection device, while moving an inkjet head 51 relative to the substrate. Specifically, color ink (liquid material) made by dispersing a pigment or dye with the respective colors (blue (B) in FIG. 1C) into a dispersant is filled in the inkjet head 52, the color ink from an ejecting nozzle is deposited in the openings H1 (liquid droplet ejecting step). The amount of the color ink in a color ink droplet L1 is controlled for each drop. In this way, after the color ink is filled in the openings H1, the solvent in the liquid material is dried and removed (drying step). The drying step can be performed by using single or in combination vacuum drying, heated-air drying, or a well-known drying method. According to the drying step, the solvent contained in the ink is evaporated, only a solid content (pigment or dye) contained in the ink remains to form a film, and the color filter 14B as shown in FIG. 1D is thus formed. A resin ingredient other than the pigment or dye may be added to the ink for forming the color filter. In this case, a color filter in which the pigment is dispersed into the resin or a color filter that is dyed by the dye is formed. In the case of using only the dye without dispersing it into the resin, since the color filter is very thin, a film such as a protective film to be formed on the color filter can have excellent flatness.

Further, so as not to dispose the ink L1 on the top face of the bank layer 141 in the liquid ejecting step, it is preferable that the surface of the bank layer 141 be made to have a lyophobic property in advance by a plasma treatment that uses fluorine-containing gas as a treatment gas. According to the above treatment, even if the landing position of the ink is misaligned, the ink beads up on the top face of the bank layer and rolls into the bank openings H1, and thus the ink is filled in the openings.

Figure 1E:
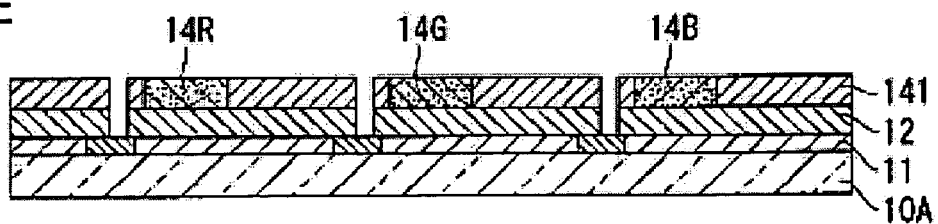

Next, as shown in FIG. 1E, by using the same step as the blue (B) color filter 14B, a red (R) color filter 14R, and a green (G) color filter 14G are formed sequentially. The forming order of the color filters 14R, 14G, 14B is not limited to the above order, and the forming process can be carried out irrespective of the order.

(2) Anode (Pixel Electrode) Forming Step

Figure 2A:
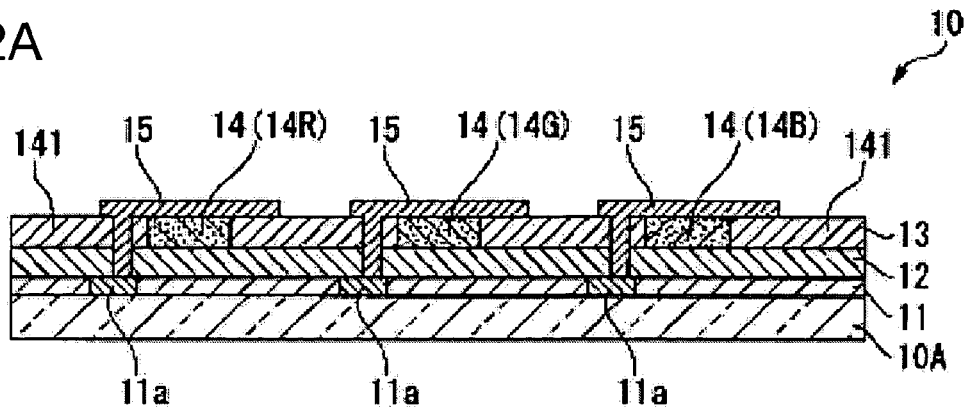
FIG. 2 is a process view showing a process subsequent to processes shown in FIG. 1.

Here, as shown in FIG. 2A, a film is formed with a conductive material on the entire substrate by using a sputtering method or a CVD method to form anodes 15 in the respective pixel regions. The anodes 15 are generally made of a transmissive conductive material such as ITO. Further, a protective film is preferably formed between the anodes 15 and the color filter layer 13, if necessary. The protective film may be formed by using the spin coating method, a roll coating method, or a dipping method. Moreover, the liquid droplet ejecting method used for forming the color filter may also be used here.

(3) Electro-Optical Layer (Light-Emitting Functional Layer) Forming Step

Figure 2B:
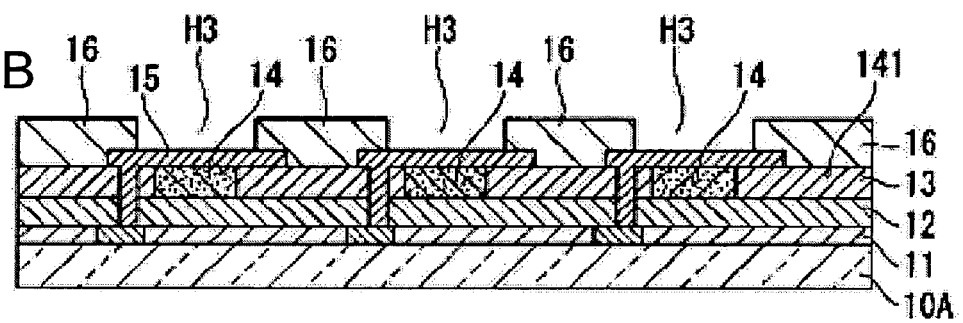

As shown in FIG. 2B, bank layers 16 for dividing the respective pixels are formed in a lattice in positions (non-pixel regions) that enclose the respective pixels. Specifically, a photosensitive material having heat resistance and solvent resistance, such as an acrylic resin or a polyimide resin is applied on the substrate, and openings H3 are formed in regions in which anodes 15 are arranged, by using a photolithographic method.

Figure 2C:
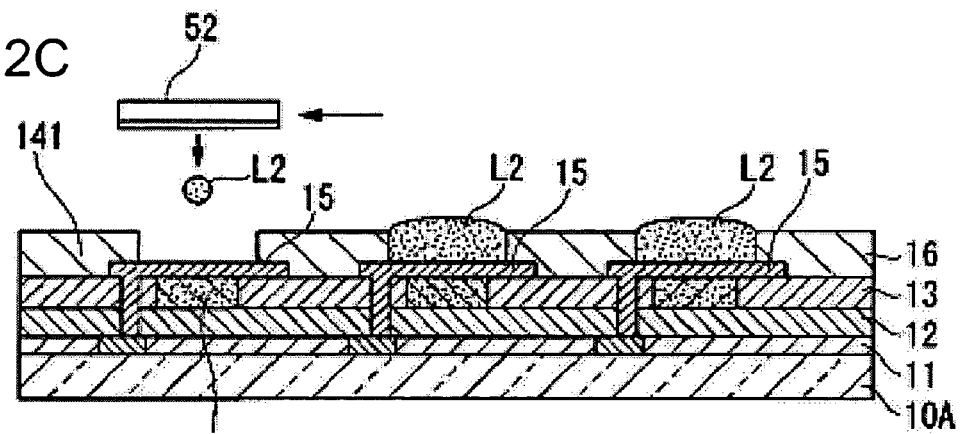
Figure 2D:
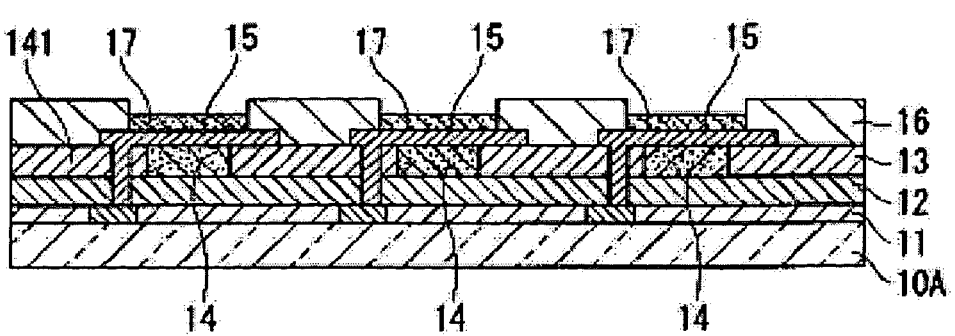

Next, as shown in FIG. 2C, a hole injecting/transporting layer is formed in the respective openings H3 of the bank layers 16 by using the liquid droplet ejection method. In this step, a liquid material L2 containing a material for forming the hole injecting/transporting layer is ejected into the bank openings H3 while moving an inkjet head 52 relative to the substrate (liquid droplet ejecting step). Therefore, after filling the liquid material L2 in the opening H3, as shown in FIG. 2D, the solvent in the liquid material is dried and removed to form a film from the material for forming the hole injecting/transporting layer contained in the liquid material L2 (drying step). Accordingly, the hole injecting/transporting layer 17 is formed on an exposed surface of the anodes 15. As the liquid material L2, a material (the material for forming hole injecting/transporting layer) in which a mixture of a polythiophene derivative such as polyethylenedioxythiophene (PEDOT) and polystyrene sulfonate (PSS,) is dissolved in a polar solvent can be used. As the polar solvent, isopropyl alcohol (IPA), n-butyl alcohol, γ-butyrolactone, N-methylpyrrolidone (NMP), 1,3-dimethyl-2-imidazoline (DMI), and derivatives thereof, or a kind of glycol, such as carbitol acetate or butyl carbitol acetate, can be used. The above material is mixed with a composition suitable for the inkjet process.

So as not to dispose the ink L2 on the top face of the bank layer 16 in the liquid ejecting step, it is preferable that the surface of the bank layer 16 be made to have a lyophobic property in advance by a plasma treatment that uses fluorine-containing gas as a treatment gas. The hole injecting/transporting forming step and subsequent steps are preferably performed under a water- and oxide-free atmosphere, for example, under a silicon atmosphere or an inert gas atmosphere, such as an argon atmosphere.

Figure 3A:
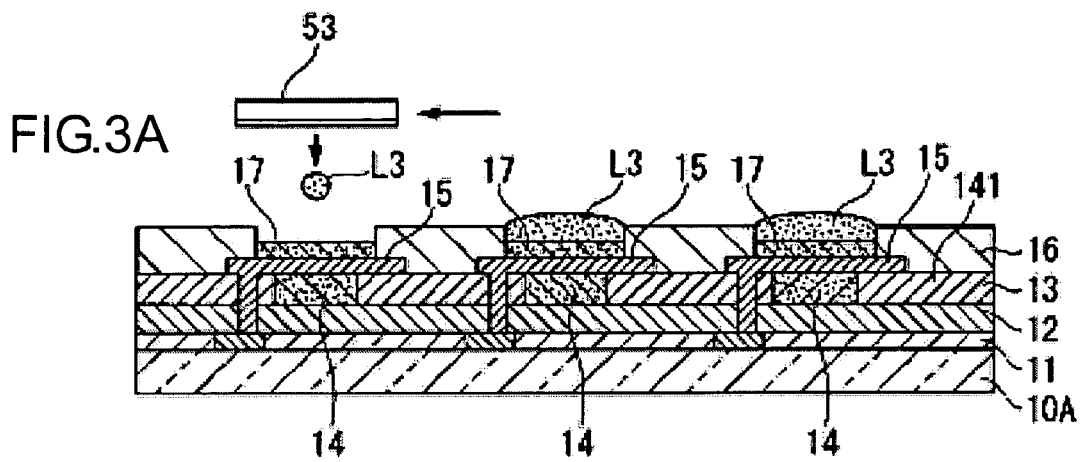
FIG. 3 is a process view showing a process subsequent to processes shown in FIG. 2.
Figure 3B:
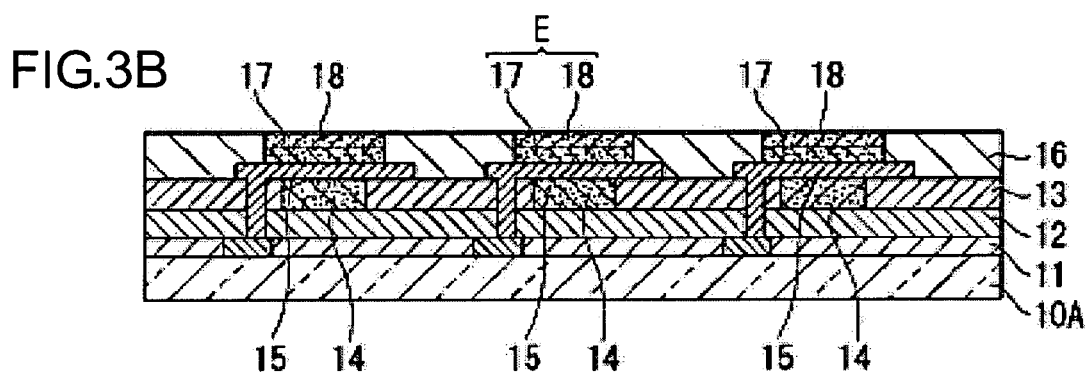
Figure 3C:
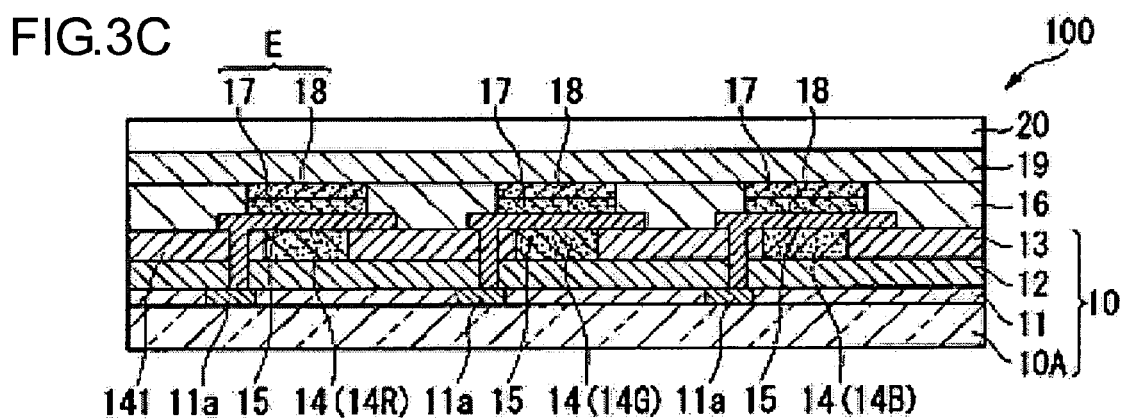
Figure 4A:
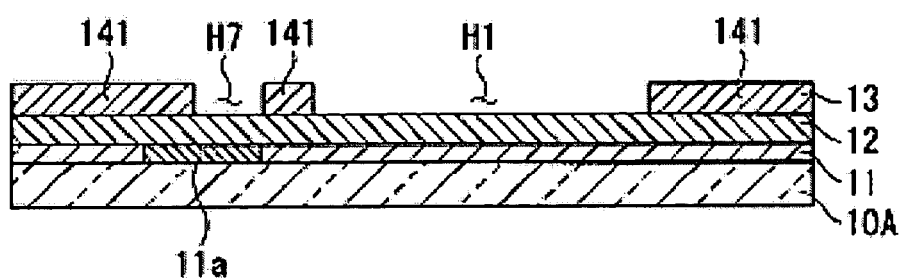
FIG. 4 is a process view showing another method of manufacturing of an element substrate.
Figure 4B:
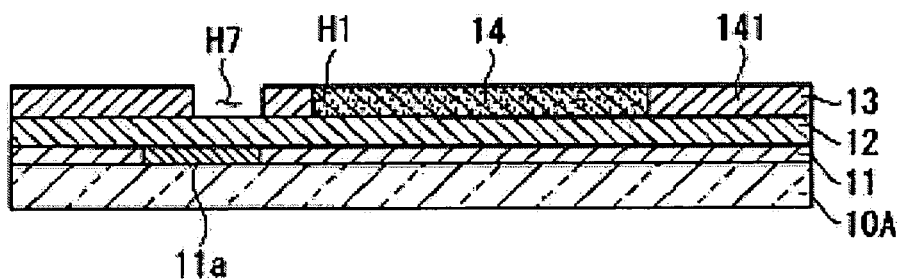
Figure 4C:
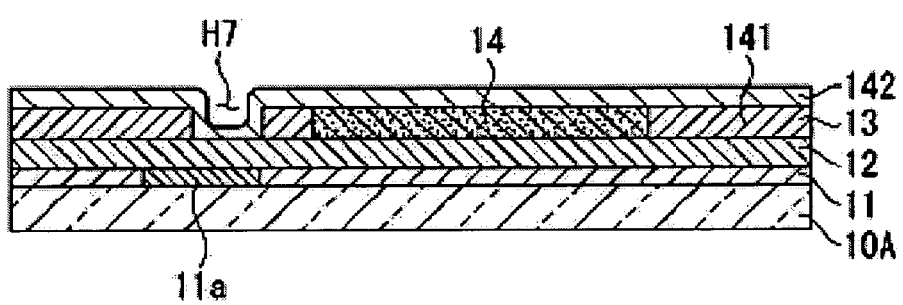
Figure 4D:
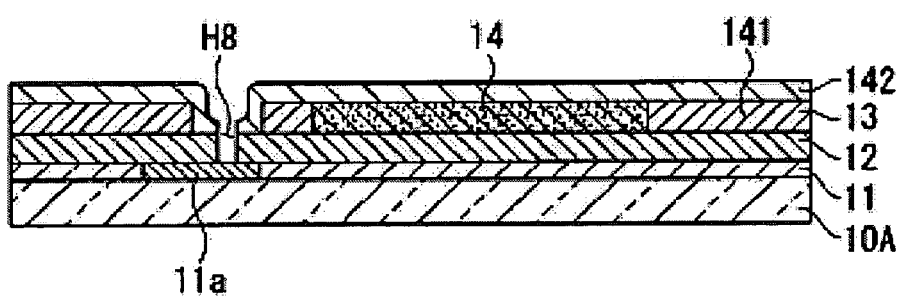
Figure 4E:
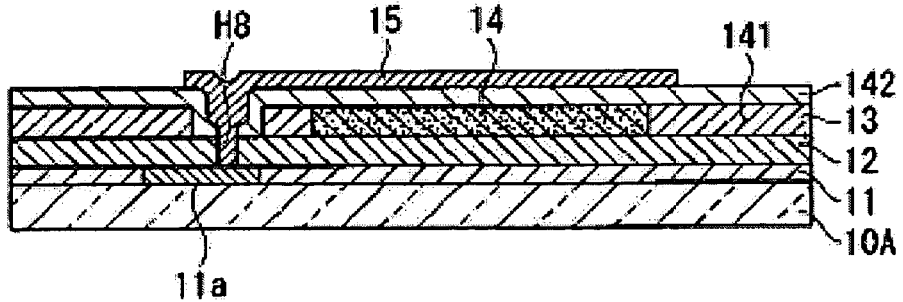

Next, as shown in FIG. 3A, a light-emitting layer is formed on the hole injecting/transporting layer 17 by using the liquid droplet ejection method. In this step, a liquid material L3 containing a material (light-emitting material) for forming the light-emitting layer is ejected into the bank openings H3 while moving an inkjet head 53 relative to the substrate (liquid droplet ejecting step). After filling the liquid material L3 in the openings H3, as shown in FIG. 3B, the solvent in the liquid material is dried and removed to form a film from the material for forming the light-emitting layer contained in the liquid material L3 (drying step). Accordingly, the light-emitting layer 18 is formed on an exposed surface of the hole injecting/transporting layer 17. As the liquid material L3, a mixture (light-emitting material) of polydioctylfluorine (PFO) and MEH-PPV in a ratio of 9:1, which is dissolved in a solvent, is preferably used. The solvent is preferably insoluble in the hole injecting/transporting layer 17, and is selected from a non-polar solvent such as cyclohexylbenzene, dihydrobenzofuran, trimethlybenzene, and tetramethylbenzene. By using a non-polar solvent as the solvent of the light-emitting material, the liquid material L3 is applied on a surface without redissolving the hole injecting/transporting layer 17.

According to the above step, the electro-optical layer E is formed on the anodes 15.

(4) Cathode (Counter Electrode) Forming Step and Sealing Step

In this step, as shown in FIG. 3C, a film is formed with a conductive material such as Al or Ag on the entire substrate by using a sputtering method or a CVD method to form a cathode 19 including a single-layered conductive layer. The cathode 19 may be formed in a single-layered structure, but in order to effectively emit light from the EL element, a laminated structure of an electron-injecting layer and a conductive layer may be used. In this case, it is preferable that an electron-injecting layer made of a material having a low work function, such as Ca or Ba be formed near the light-emitting layer. Further, it is preferable that a thin layer made of LiF be formed at the light-emitting layer side of the Ca or Ba, similar to the light-emitting material. The film-forming method of the electron-injecting layer and the conductive layer may be suitably selected from well-known film-forming methods, such as, a resistance heating evaporation method or a sputtering method. The thickness of the cathode 19 preferably ranges from 100 to 1000 nm, and more preferably, from 200 to 500 nm. Since the cathode 19 is formed by using the evaporation method or the sputtering method, which is different from the process of forming the hole injecting/transporting layer 17 or the light-emitting layer 18, the conductive material is provided on the entire surface of the substrate, rather than selectively being provided only on the pixel region.

Next, in order to prevent the cathode 19 or electro-optical layer E from deteriorating due to the moisture or oxidation, a sealing material 20 is provided on the entire substrate so as to cover the cathode 19. The sealing material 20 preferably has a gas barrier property and is selected from, for example, a silicon oxide such as $SiO_2$, a silicon nitride such as SiN, or a silicon oxynitride such as $SiO_xN_y$. More preferably, a resin layer such as acryl, polyester, or epoxy may be laminated on an inorganic oxide layer.

As described above, since the light-emitting material is selectively provided only on a required region by using the liquid droplet ejection method, in this embodiment, it is possible to effectively utilize the expensive light-emitting material. Further, according to the present embodiment, since the white-light-emitting layer 18 and the color filters 14R to 14B are sequentially laminated on the same substrate, there is no need for a bonding process, which is required in the case of forming the color filters on a substrate different from the substrate main body 10A in order to bond both substrates. Therefore, it is possible to obtain high precision.

The preferred embodiments according to the present invention have been explained with reference to FIGS. 1 to 3, but this invention is not limited to the above embodiments. The shape of the components or combination thereof described in the above embodiment is only an example, and various modifications may be made as needed, without departing from the spirit and scope of the present invention. For example, according to the present embodiment, the step of forming the element substrate 10 comprises steps of forming the circuit element portion 11, forming the interlayer insulating film 12, forming the bank layer 141, forming the openings HI and H2, forming the color filters 14, and forming the pixel electrodes, in this order, but the order is limited thereto. It is possible to change the order depending on the specifications.

FIG. 4 shows an example for forming contact holes H2 after forming the color filters 14. In this embodiment, the circuit element portion 11, the interlayer insulating film 12, and the bank layer 141 are sequentially formed on the substrate main body 10A, by using the same method as shown in FIG. 1A. Next, as shown in FIG. 4A, by using photolithographic method, openings H1 are formed at positions corresponding to the respective pixels, and openings H7 are formed at positions corresponding to TFTs 11a. Subsequently, as shown in FIG. 4B, by using the liquid droplet ejection method, the color filters 14 are formed in the openings H1. Thereafter, as shown in FIG. 4C, an inorganic insulating film 142 made of $SiO_2$ is formed so as to cover the surfaces of the bank layer 141, the color filters 14, and the inner surface of the openings H7 of the bank layer 141. The inorganic insulating film 142 functions to protect the bank layer 141 and the color filter 14 from being damaged by the etching material when forming the contact hole in the interlayer insulating film 12 and to prevent the bank layer 141 formed of the same organic film as a resist mask from being removed together with the resist when removing the resist mask used for etching. Next, as shown in FIG. 4D, the inorganic insulating film 142 and the interlayer insulating film 12 are etched to form openings H8 (contact hole) which lead to TFTs 11a formed in the openings H7. Next, as shown in FIG. 4E, a film of the conductive material is formed on the entire substrate by using the sputtering method or CVD method and is patterned to form anodes 15 in a pixel region. As a result, the element substrate 10 is formed.

Second Embodiment

Hereinafter, an organic EL device and a method of manufacturing the same according to the present embodiment will be described with reference to FIGS. 5 to 7.

Figure 7A:
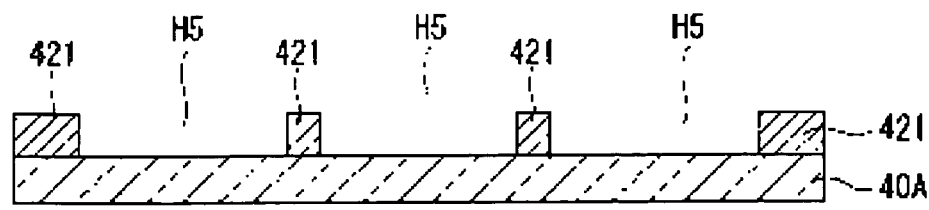
FIG. 7 is a process view showing a process subsequent to processes shown in FIG. 6.
Figure 7B:
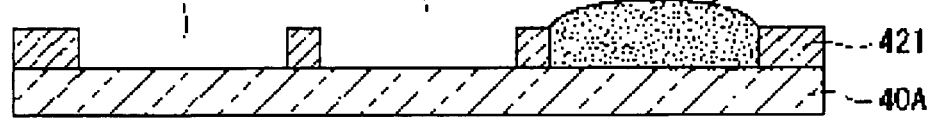
Figure 7C:
Figure 7D:
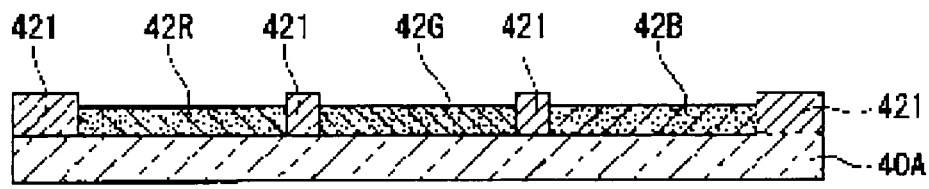
Figure 7E:
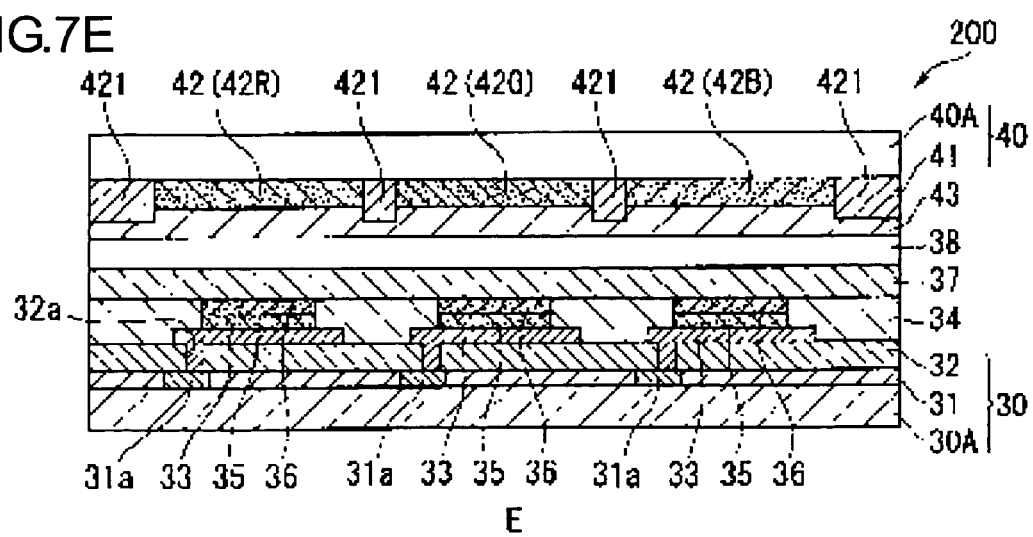

The organic EL device according to the present embodiment is a top-emission-type full-color organic EL display device in which an element substrate 30 with EL elements formed thereon and a counter substrate 40 with three color filters, that is, R (red), G (green), and B (blue) color filters 42 (42R, 42G, 42B), formed thereon are bonded by an adhesive layer 43, as shown in FIG. 7E. In the organic EL display device 200 of the present embodiment, a bank layer 34 for dividing pixels on the element substrate 30 having anodes (pixel electrodes) 33 provided thereon is provided. An electro-optical layer (light-emitting functional layer) E having a white-light-emitting material is formed in a region which is divided by the bank layer 34. Openings are formed in the bank layer 34 at positions corresponding to each of the pixels. The above electro-optical layer E is formed at positions where the anodes 33 are exposed by the openings. Therefore, a cathode (counter electrode) 37 is provided so as to cover the bank layer 34 and the light-emitting functional layer E.

Since the present embodiment has been applied to a top-emission-type structure in which light emitted from the electro-optical layer E is transmitted through the cathode side, the cathode 37 is made of a co-deposited film of Bathocuproin (BCP) and Cesium (Cs) and is formed in a structure that ITO is laminated thereon in order to give the conductivity. In addition, in order that the light emitted to the anodes 33 can be transmitted through the cathode, the anodes 33 is preferably made of a metal material having a high reflectance, such as Al or Ag, or is formed by using a laminated structure having a light-transmitting material and a high reflectance metal material, such as Al/ITO. It is similar to the first embodiment in that the cathode 37 is disposed so as to cover the bank layer 34 and an exposed surface of an electro-optical layer E to function as a common electrode for each pixel. Other than the above structure, the cathode can be formed by a film on which an electron-injecting layer made of thin metal layer having a low work function (for example, Ca, Mg, Ba, Sr) and an electrode main body made of a thick metal layer (for example, Al, Ag, Au) are formed so as to have a thickness of 50 nm or less in total.

In the element substrate 30, a circuit element portion 31, and an interlayer insulating film 32 are laminated sequentially on the substrate main body 30A made of glass or resin. The above-mentioned anodes 33 are arranged in a matrix on the interlayer insulating film 32 so as to correspond to each pixel. Various wiring lines, such as scanning lines or signal lines, and circuits, such as storage capacitors (not shown) for storing an image signal and TFTs 31a serving as a pixel switching element, are provided in the circuit element portion 31. Since the present embodiment has adopted the top-emission-type structure, the substrate main body 30A does not need to be transparent. Therefore, it is possible to use a translucent or opaque substrate such as a semiconductor substrate, other than the transmitting substrate such as glass, as the substrate main body 30A.

The electro-optical layer E is formed by laminating a hole injecting/transporting layer 35 and a white-light-emitting layer 36 containing a white-light-emitting material in this order from the lower layer. The material for forming the above is the same as the first embodiment, thus the description thereof will be omitted.

The above-mentioned substrate is sealed by a sealing material 38. The sealing material 38 preferably has a gas barrier property and is selected from, for example, a silicon oxide, silicon nitride, or silicon oxynitride. More preferably, a resin layer such as acryl, polyester, or epoxy may be laminated on the above inorganic oxide layer. In addition, a protective film may be provided between the cathode 37 and the sealing material 38, if necessary.

In contrast, a color filter layer 41 is formed on a transmissive main body 40A of the counter substrate 40, which is made of glass or resin. Three color filters, that is, R, G, and B color filters 42R, 42G, 42B, are arranged in a matrix with a shape divided by the bank layer 421, in the color filter layer 41. The bank layer 421 has an opening provided at a position that overlaps an opening of the bank layer 34 in plan view, and each of the color filters 42R, 42G, 42B is arranged in a region divided by the bank layer 421.

Hereinafter, a method of manufacturing the organic EL device according to this embodiment will be described.

The method of manufacturing the organic EL device 200 according to this embodiment comprises (1) an electro-optical layer (light-emitting functional layer) forming step, (2) a cathode (counter electrode) forming step, and sealing step, (3) a color filter forming step, and (4) a bonding step. The manufacturing method is not limited to the above embodiment: but other steps may be omitted therefrom or other steps may be added thereto, if necessary. The steps will be described below.

(1) Electro-Optical Layer (Light-Emitting Functional Layer) Forming Step

Figure 5A:
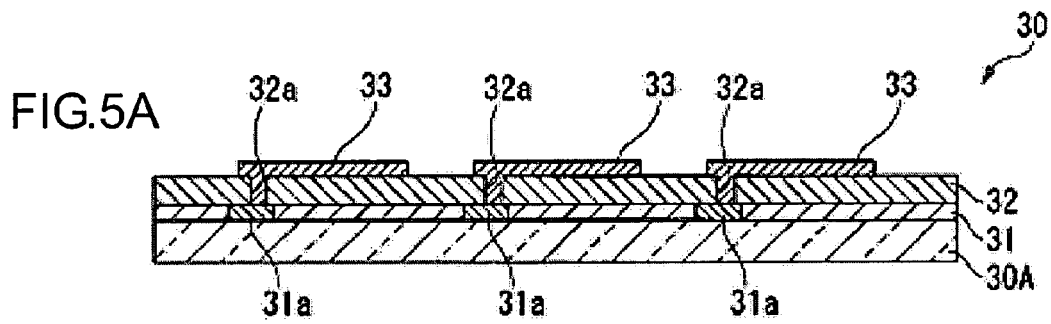
FIG. 5 is a process view showing a method of manufacturing an organic EL device according to a second embodiment.

As an initial step, as shown in FIG. 5A, a substrate main body 30A on which the circuit element portion 31, the interlayer insulating film 32, and anodes (pixel electrode) 33 are formed is prepared. These circuit element portion 31, interlayer insulating film 32, and anodes 33 may be formed by using a well-known method.

Figure 5B:
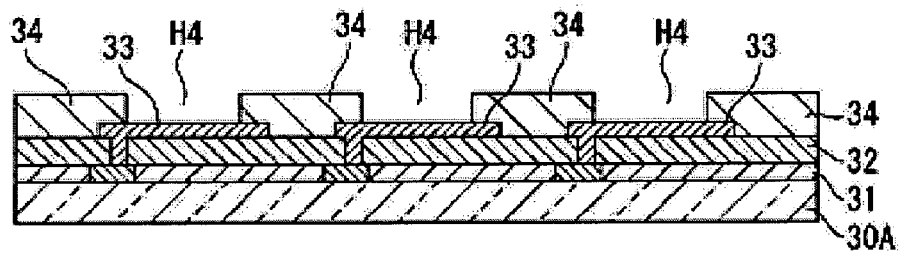

Next, as shown in FIG. 5B, bank layers 34 made of a photosensitive material are formed in a lattice in positions (non-pixel regions) that enclose the respective pixels. Specifically, the photosensitive material having heat resistance and solvent resistance, such as an acrylic resin or a polyimide resin, is applied on the substrate, and openings H4 are formed at positions at which the anodes 33 are arranged, by using photolithography.

Figure 5C:
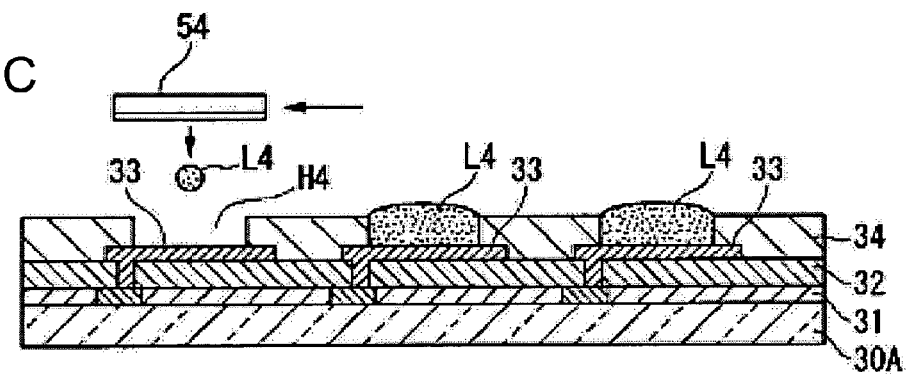
Figure 5D:
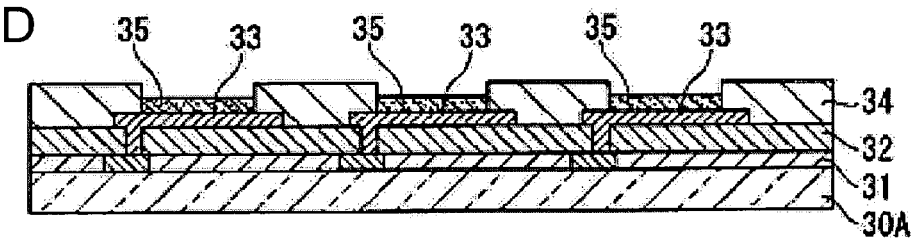

Next, as shown in FIG. 5C, a hole injecting/transporting layer is formed in the respective openings H4 of the bank layers 34 by using the liquid droplet ejection method. In this step, a liquid material L4 containing a material for forming the hole injecting/transporting layer is ejected into the bank openings H4, while moving an inkjet head 54 relative to the substrate (liquid droplet ejecting step). Therefore, after filling the liquid material L4 in the opening H4, as shown in FIG. 5D, the solvent in the liquid material is dried and removed to form a film from the material for forming the hole injecting/transporting layer contained in the liquid material L4 (drying step). Accordingly, the hole injecting/transporting layer 35 is formed in an exposed surface of the anodes 33. The liquid material L4 may be similar to the liquid material L2 in the first embodiment.

So as not to dispose the ink L4 on the top face of the bank layer 34 in the liquid ejecting step, it is preferable that the surface of the bank layer 34 be made to have a lyophobic property in advance by a plasma treatment that uses fluorine-containing gas as a treatment gas. The hole injecting/transporting forming step and subsequent steps are preferably performed under water- and oxide-free atmosphere, for example, under an inert gas atmosphere, such as an argon atmosphere.

Figure 6A:
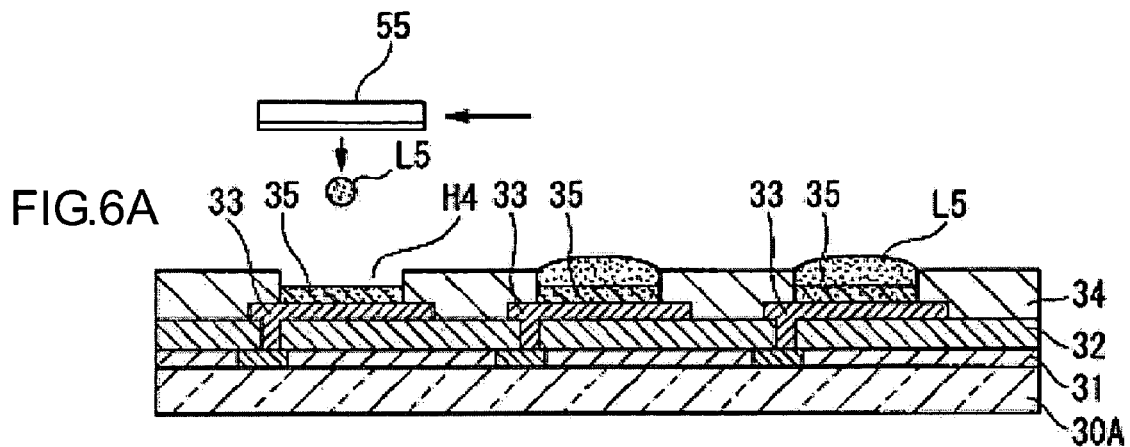
FIG. 6 is a process view showing a process subsequent to processes shown in FIG. 5.
Figure 6B:
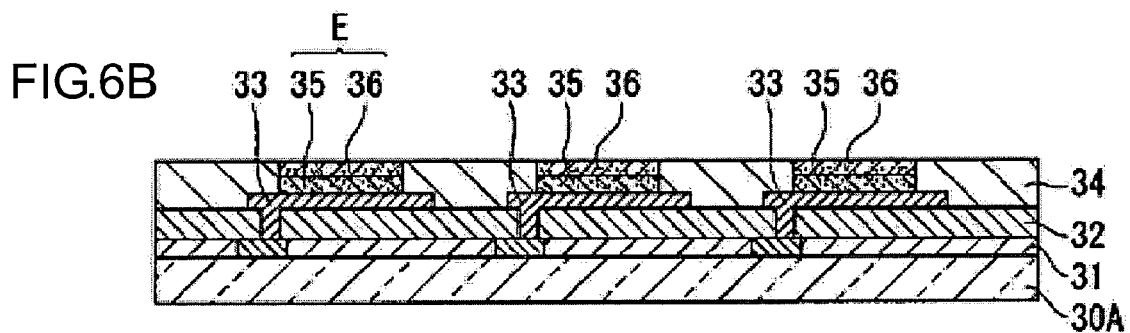

Next, as shown in FIG. 6A, a light-emitting layer is formed on the hole injecting/transporting layer 35 by using the liquid droplet ejection method. In this step, a liquid material L5 containing a material (light-emitting material) for forming the light-emitting layer is ejected into the bank openings H4, while moving an inkjet head 55 relative to the substrate (liquid droplet ejecting step). After filling the liquid material L5 in the opening H4, as shown in FIG. 6B, the solvent in the liquid material is dried and removed to form a film from the material for forming the light-emitting layer contained in the liquid material L5 (drying step). Accordingly, the light-emitting layers 36 are formed on exposed surfaces of the hole injecting/transporting layer 35. Further, the liquid material L5 may be similar to the liquid material L3 in the first embodiment.

According to the above step, the electro-optical layer E is formed on the anodes 33.

(2) Cathode (Counter Electrode) Forming Step, and Sealing Step

Figure 6C:
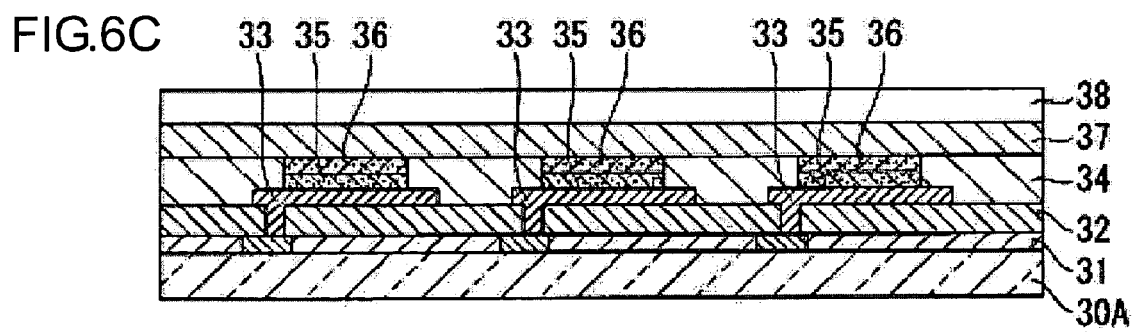

A co-deposited film of BCP and Cs is formed on electro-optical layer E and the exposed surface of the bank layer 34, and further a film of a transmissive conductive material such as ITO is formed on the entire substrate by using the sputtering method or CVD method in order to give the conductivity. Accordingly, a cathode 37 is formed on the substrate (FIG. 6C). Furthermore, the cathode 37 may be formed by using a laminated structure of an electron-injecting layer and a conductive layer, such as Ca/ITO. In this case, it is preferable that an electron-injecting layer made of a material having a low work function, such as Ca or Ba be formed near the light-emitting layer. Further, it is preferable that a thin layer made of LiF be formed at the light-emitting layer side of the Ca or Ba, similar to the light-emitting material. The film-forming method of the electron-injecting layer and the conductive layer may be suitably selected from well-known film-forming methods, such as a resistance heating evaporation method or a sputtering method. The thickness of the cathode 37 preferably ranges from 100 to 1000 nm, and more preferably from 200 to 500 nm. Since the cathode 37 is formed by using the evaporation method or the sputtering method, which is different from the forming process of the hole injecting/ transporting layer 35 or the light-emitting layer 36, the conductive material is provided on the entire surface of the substrate, rather than selectively being provided only on the pixel region.

Next, in order to prevent the cathode 37 or electro-optical layer E from deteriorating due to the moisture or oxidation, a sealing material 38 is provided on the entire substrate so as to cover the cathode 37. The sealing material 38 preferably has a gas barrier property, for example, a silicon oxide such as $SiO_2$, a silicon nitride such as SiN, or a silicon oxynitride such as $SiO_xN_y$. More preferably, a resin layer such as acryl, polyester, or epoxy may be laminated on an inorganic oxide layer.

(3) Color Filter Forming Step

To begin with, a transmissive substrate main body 40A such as glass or resin is prepared. Then, as shown in FIG. 7A, on the substrate main body 40A, bank layers 421 made of a photosensitive material are formed in a lattice in positions (that is, non-pixel regions of the pixel substrate 30) that enclose the respective pixels. Specifically, a photosensitive material having heat resistance and solvent resistance, such as acrylic resin or polyimide resin, is applied on the substrate, and openings H5 are formed at positions corresponding to the respective pixels by using photolithography method.

Next, color filters having colors corresponding to the respective openings H5 of the bank layers 421 are formed by using the liquid droplet ejection method. In this step, a liquid material containing a material for forming a color filter is ejected into the bank openings H5 by using an inkjet device as the liquid droplet ejection device, while moving an inkjet head 56 relative to the substrate. Specifically, color ink (liquid material) made by dispersing a pigment or dye with the respective colors (blue (B) in FIG. 7B) into a dispersant is filled in the inkjet head 56, the color ink from an ejecting nozzle is deposited in the openings H5 (liquid droplet ejecting step). The amount of the color ink in a color ink droplet L6 is controlled for each drop. In this way, after the color ink is filled in the openings H5, the solvent in the liquid material is dried and removed (drying step). The drying step can be performed by using single or in combination vacuum drying, heated-air drying, or a well-known drying method. As result of this drying step, the solvent contained in the ink is evaporated, only a solid content (pigment or dye) contained in the ink remains to the last to form a film, and the color filter 42B as shown in FIG. 7C is formed. Further, so as not to dispose the ink L6 on the top face of the bank layer 421 in the liquid ejecting step, it is preferable that the surface of the bank layer 421 be made to have a lyophobic property in advance by a plasma treatment that uses fluorine-containing gas as a treatment gas. According to the above treatment, even though the landing position of the ink is misaligned, the ink beads up on the top face of the bank layer and rolls into the bank openings H5, and thus the ink is filled in the opening.

Next, as shown in FIG. 7D, by using a step similar to the step in the case of the blue (B) color filter 42B, a red (R) color filter 42R and a green (G) color filter 42G are formed sequentially. The forming order of the color filters 42R, 42G, 42B is not limited to the above order, and the forming process can be carried out irrespective of the order.

(4) Bonding Step

In this step, both substrates 30 and 40 are bonded by the adhesive layer 43 while aligning the position of the pixels on the element substrate 30 and the color filters 42. In this step, a beta sealing method in which an adhesive is applied to the entire counter substrate 40 to bond the counter substrate 40 to the element substrate 30 is used.

As described above, since the light-emitting material is selectively provided only on a required region by using the liquid droplet ejection method, in this embodiment, it is possible to effectively utilize the expensive light-emitting material. Further, according to the present embodiment, after the white-light-emitting layer 36 and the color filters 42R to 42B are formed on different substrates, both substrates are bonded to each other. Therefore, the second embodiment has an advantage in yield, compared with the case of forming them on the same substrate, as in the first embodiment.

Further, the color filter layer 41 is formed by using the liquid droplet ejection method in this embodiment, but other methods, such as the photolithography, may be used.

Third Embodiment

Next, an organic EL device and a method of manufacturing the same according to a third embodiment of the present invention will be described with reference to FIGS. 8 and 9. In this embodiment, the same elements or portions as those of the second embodiment are represented by the same reference numerals, and the description thereof will be omitted.

Figure 9A:
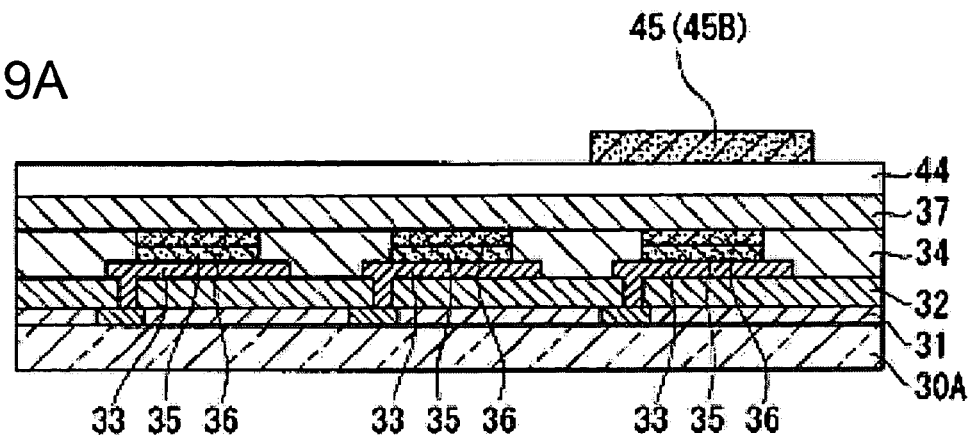
FIG. 9 is a process view showing a process subsequent to processes shown in FIG. 8.

The organic EL device of this embodiment is a top-emission type full-color organic EL display device in which the color filters in the second embodiment are laminated directly on the element substrate. That is, as shown in FIG. 9C, a plurality of EL elements in which anodes (pixel electrodes) 33, an electro-optical layer (light-emitting functional layer) E, and a cathode 37 are laminated on a substrate main body 30A in this order is provided in the organic EL display device according to the present embodiment. Three color filters, that is, R (red), G (green), and B (blue) color filters 45 (45R, 45G, 45B), are formed in island shapes on the EL elements with a protective layer 44 interposed therebetween. The substrate formed by the above structure is sealed by a sealing material 46. As the sealing material 46, a material having high gas barrier properties may be used like the sealing material 38 in the second embodiment.

Further, since the remaining structure including the cathode 37 is similar to that of the second embodiment, the description thereof will be omitted.

Next, a method of manufacturing the organic EL device according to the present embodiment will be described.

In this embodiment, the step of forming the electro-optical layer and the step of forming the cathode 37 are similar to those of the second embodiment, and therefore, only the subsequent steps will be described.

After forming the electro-optical layer E and the cathode 37 on the element substrate by the steps shown in FIGS. 4A to 6C, a protective film 44 is formed on the cathode 37 in this embodiment. The protective film 44 may be formed in a double-layered structure of an inorganic oxide layer and an organic layer. The inorganic oxide layer is made of TEOS (tetraethoxysilane) and oxygen gas by using plasma CVD method. Further, a thermosetting epoxy resin in which an ultraviolet absorber is mixed is laminated on the inorganic oxide layer, and is hardened at 50° C. to form the organic layer.

Figure 8A:
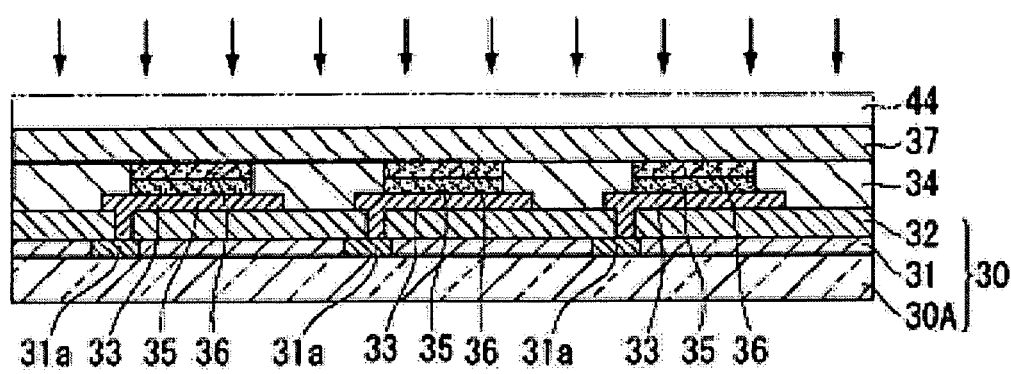
FIG. 8 is a process view showing a method of manufacturing an organic EL device according to a third embodiment.

Next, as shown in FIG. 8A, plasma treatment using a fluorine-containing gas (for example, $CF_4$) is performed on a surface of the substrate on which the protective film 44 is formed to make the surface of the protective film have a lyophobic property.

Figure 8B:
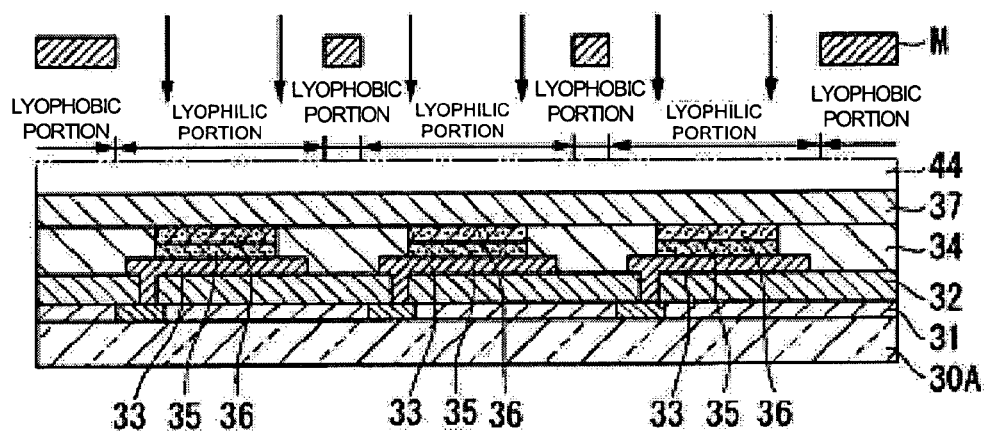

Subsequently, as shown in FIG. 8B, ultraviolet rays are selectively irradiated onto the respective pixel regions (that is, a region in which the color filters 45R, 45G, and 45B are formed in FIG. 9) by mask exposure to make the surface of the protective film 44 in the respective pixel regions to have a lyophilic property. In FIG. 8B, the lyophobic portion is shown by the dashed line, and the lyophilic portion is shown in the solid line. 'Lyophilic portion' refers to a region having a relatively higher affinity for a liquid material used in the liquid droplet ejection method than the lyophobic portion. Further, in FIG. 8B, the reference symbol M represents the mask.

According to this step, the lyophobic portion is patterned on the protective film 40.

Figure 8C:
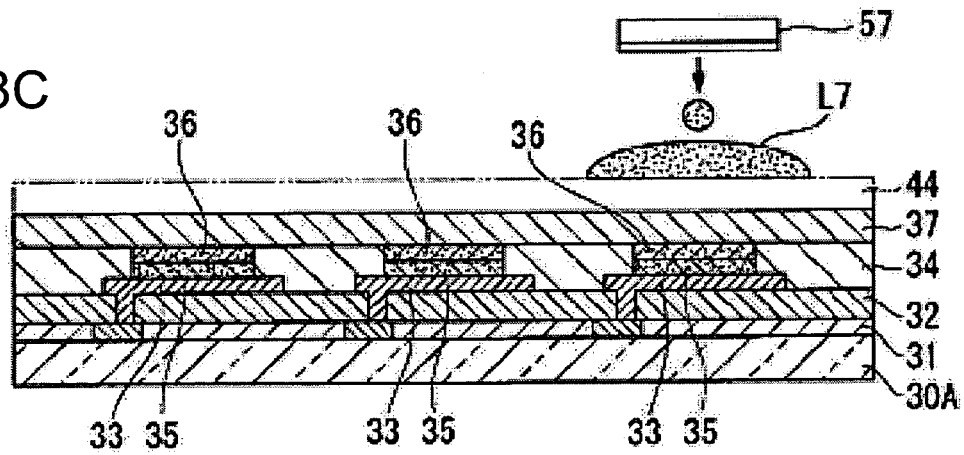

Next, as shown in FIG. 8C, corresponding color filters are formed in the lyophilic portion formed on the surface of the protective film. In this step, by using an inkjet device as the liquid droplet ejection device, a liquid material containing a material for forming the color filter is ejected onto the lyophilic portion, while moving an inkjet head 57 relative to the substrate. Specifically, color ink (liquid material) made by dispersing a pigment or dye with the respective colors (blue (B) in FIG. 8C) into a dispersant is filled in the inkjet head 57, the color ink from an ejecting nozzle is deposited on the lyophilic portion (liquid droplet ejecting step). The amount of the color ink in a color ink droplet L1 is controlled for each drop. In this way, after the color ink is ejected into the lyophilic portion, the solvent in the liquid material is dried and removed (drying step). The drying step can be performed by using single or in combination vacuum drying, heated-air drying, or a well-known drying method. According to the drying step, the solvent contained in the ink is evaporated, only the solid content (pigment or dye) contained in the ink remains to form a film, and the color filter 45B as shown in FIG. 9A is thus formed. In this step, since a region (non-pixel region) other than the pixel region is made to be lyophobic, the ejected ink is effectively disposed only on the lyophilic portion (that is, the pixel region) without spreading over the pixel region.

Figure 9B:
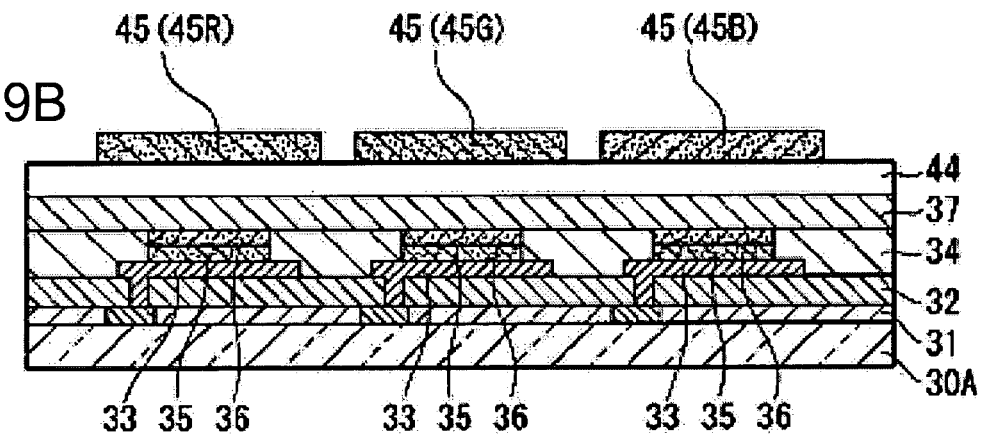
Figure 9C:
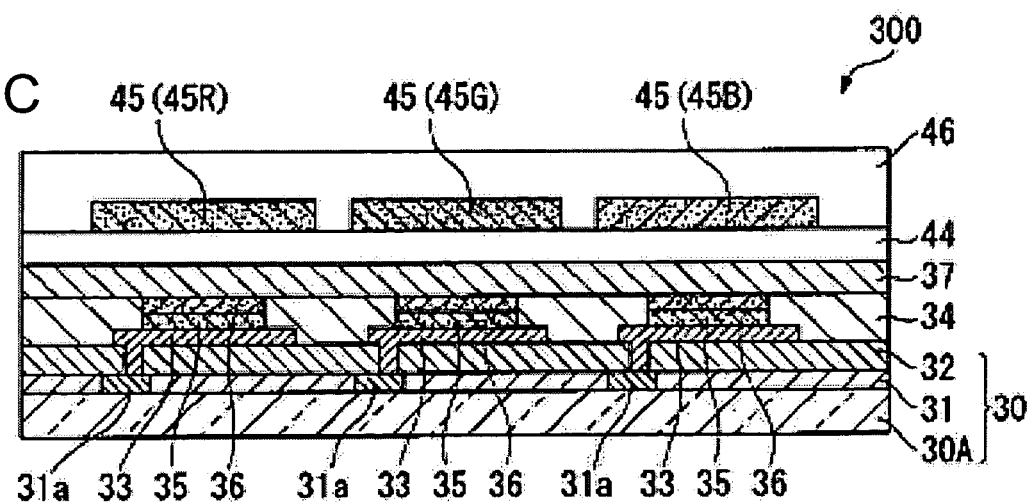

Subsequently, as shown in FIG. 9B, by using the same step as the blue (B) color filter 45B, a red (R) color filter 45R and a green (G) color filter 45G are sequentially formed. The forming order of the color filters 45R, 45G, and 45B is not limited to the above order, and the forming process can be carried out irrespective of the order.

Further, in order to prevent the cathode 37 or electro-optical layer E from deteriorating due to the moisture or oxidation, a sealing material 46 is provided on the entire substrate so as to cover the cathode 37. The sealing material 46 may be the same as the sealing material 38 in the second embodiment.

Therefore, since the light-emitting material is selectively provided only on a required region by using the liquid droplet ejection method, in this embodiment, it is possible to effectively utilize the expensive light-emitting material. Further, according to the present embodiment, since the electro-optical layer E and the color filters 45 are sequentially laminated from the lower layer on the same substrate, there is no need for alignment, similar to the second embodiment including a bonding process. Therefore, it is possible to obtain high precision. Further, in this embodiment, the color filters 45 are formed without providing the bank layer. Therefore, by preventing the deterioration of the cathode 37 or electro-optical layer E on a base from the wet process during formation of a bank layer, the organic EL device having high reliability can be obtained.

In this embodiment, a layer in which the epoxy resin is laminated on the inorganic oxide film is used as the protective film, but other than the epoxy resin, a resin layer such as acryl or polyester, polyeterusulfone, or polyimide may be laminated thereon. Furthermore, the lyophobic portion is formed by performing plasma treatment on the surface of the protective film, but a self-assembled film (FAS film) represented by a general expression $R_n SiX_{(4-n)}$ may be formed as a substitute. Herein, n is an integer of 1 to 3, and X is a hydrolytic group such as a methoxy group, an ethoxy group, or a halogen atom. In addition, R is a fluoroalkyl group. The hydrolytic group represented by X forms silanol by hydrolysis, and reacts with the hydroxyl group on a base of the substrate (such as glass, silicon) to be coupled with the substrate by a siloxane bonding. On the other hand, since R has a fluoric group such as $CF_3$ on the surface thereof, the base surface of the substrate is modified to a no-leakage surface (a surface having the low energy). The FAS film is dissolved by irradiating it with ultraviolet rays. Therefore, the ultraviolet rays are irradiated onto the FAS film which is arranged in the pixel region by mask exposure to make the surface of the protective film partially have a lyophilic property. As a result, it is possible to pattern the lyophobic portion on the surface of the protective film. The method of forming the lyophobic portion (water repellent pattern) can be used in other steps in addition to the color filter forming step. Further, in this embodiment, although the color filter 45 is formed without using the bank layer, it does not exclude the method that uses the bank layer. For example, it is possible to form a film of the water repellent resin by the vacuum evaporation method using the evaporation mask, and to form the color filters by using the resin as a bank layer. In this case, it is further possible to form the color filters by arranging the color ink in openings of the bank layer by the liquid droplet ejection method.

Fourth Embodiment

Next, an organic EL device and a method of manufacturing the same according to a fourth embodiment of the present invention will be described with reference to FIGS. 10 to 13. The organic EL device 400 according to this embodiment is an organic EL device in which organic EL elements are arranged as pixels on a substrate and is a bottom-emission organic EL display device in which light emitted from the light-emitting layer transmitted through the substrate side to display. Since the basic structure of the organic EL device 400 according to this embodiment is similar to the organic EL device according to the first embodiment, the same elements or portions in FIGS. 10 to 13 as those in FIGS. 1 to 3 are represented by the same reference numerals, and the description thereof will be omitted.

Figure 10:
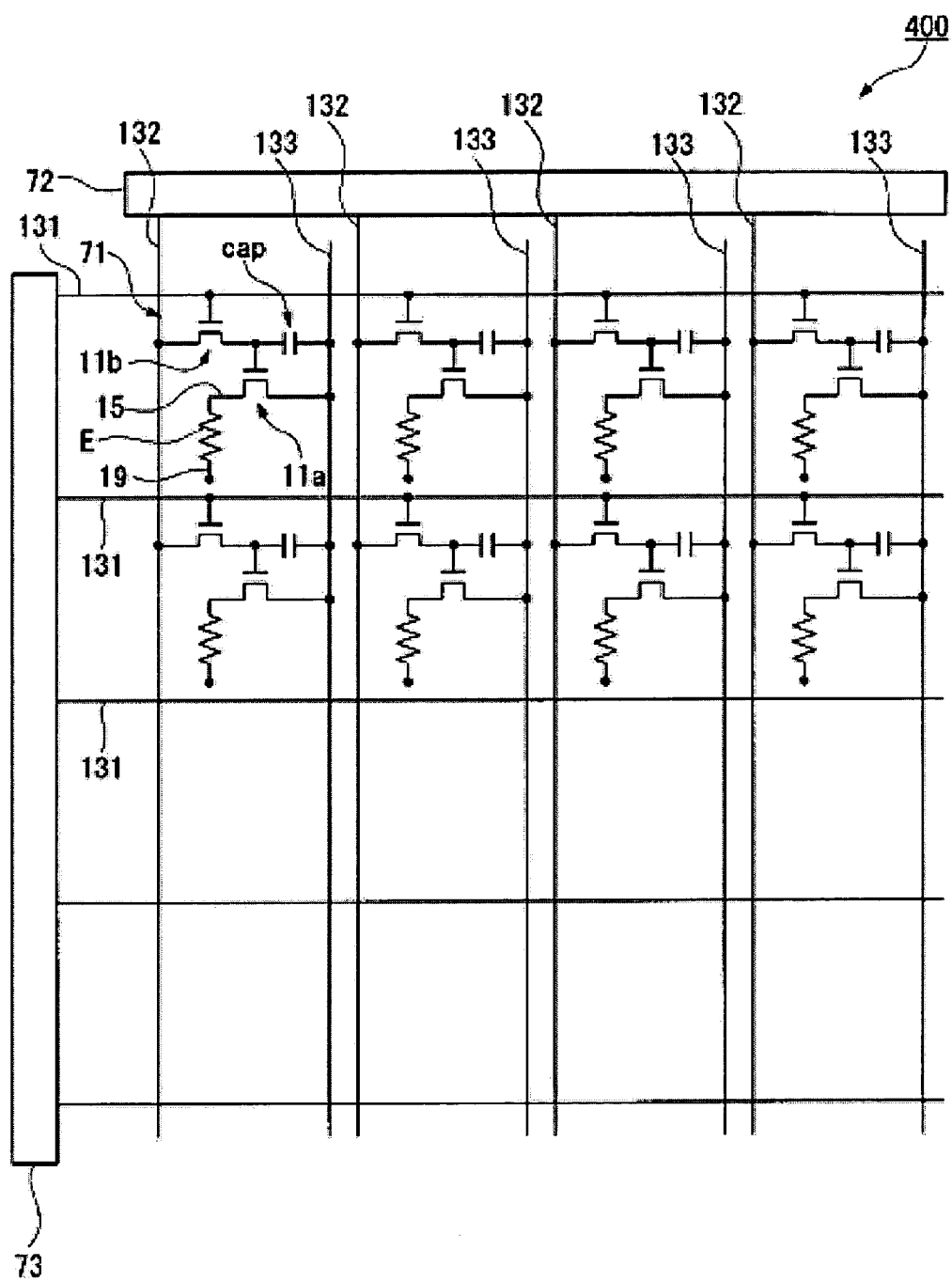
FIG. 10 is a circuit diagram of an organic EL device according to a fourth embodiment.
Figure 11:
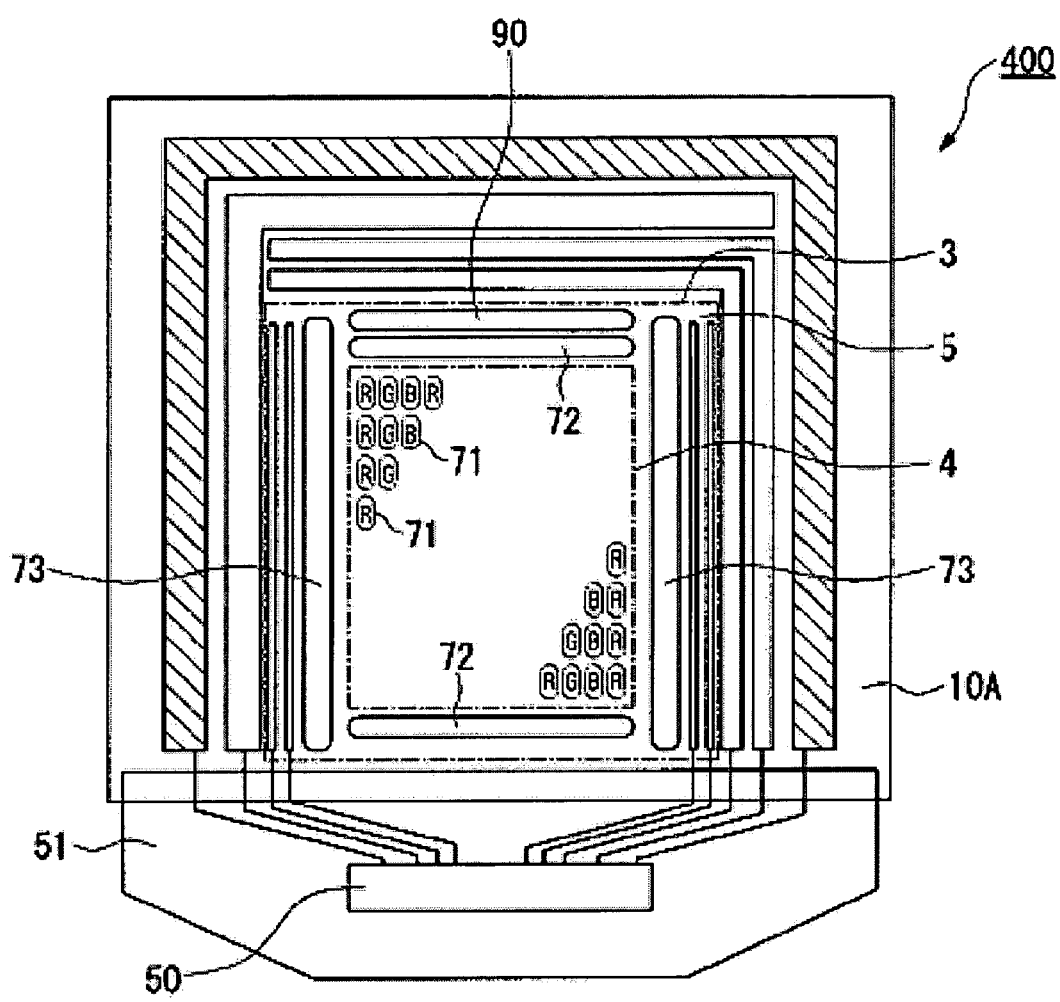
FIG. 11 is a plan view of FIG. 10.
Figure 12:
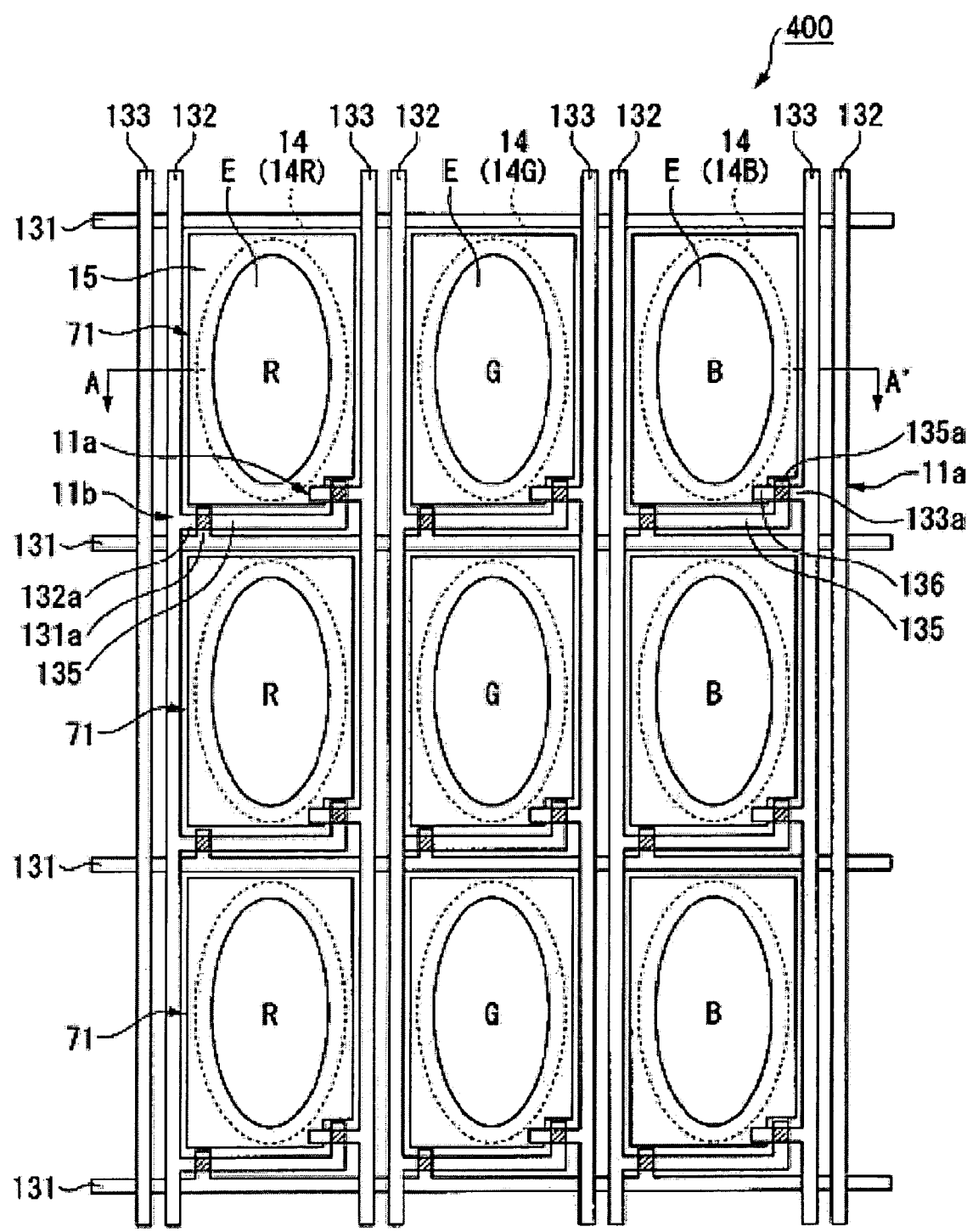
FIG. 12 is a schematic plan view showing a pixel structure.
Figure 13:
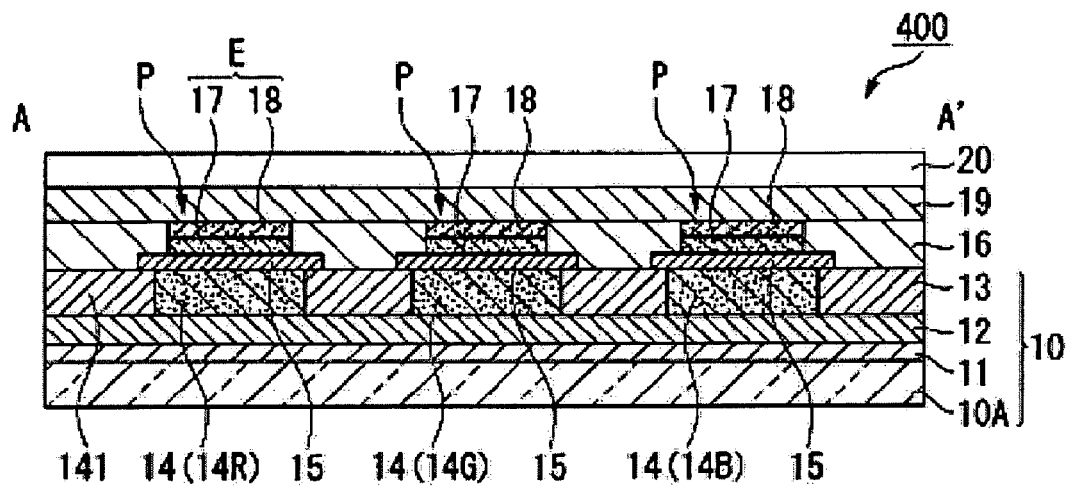
FIG. 13 is a schematic view showing a cross-section along the line A-A' of FIG. 12.

FIG. 10 is a circuit diagram of an organic EL device according to this embodiment, FIG. 11 is a plan view of the organic EL device, FIG. 12 is a schematic plan view showing an expanded pixel structure, and FIG. 13 is a schematic view showing a cross-section along the line A-A' of FIG. 12, which corresponds to FIG. 3C.

As shown in FIG. 10, in the organic EL device 400, a plurality of scanning lines 131, a plurality of signal lines 132 which extends in a direction intersecting the scanning lines 131, and a plurality of power lines 133 extending parallel to the signal lines 132 are wired on the substrate, and pixel regions 71 are provided at intersections of the scanning lines 131 and the signal lines 132.

A data-line driving circuit 72 including a shift register, a level shifter, video lines, and an analog switch is provided for the signal lines 132. A scanning-line driving circuit 73 including a shift register and a level shifter is provided for the scanning lines 131. Each of the pixel regions 71 comprises switching TFTs (thin film transistors) 11b each having a gate electrode to which a scanning signal is supplied via the scanning line 131, storage capacitors cap which store image signals (electric power) which is supplied from the signal line 132 via the switching TFT (thin film transistor) 11b, driving TFTs 11a each having a gate electrode to which the image signal stored by the storage capacitor cap is supplied, anodes (pixel electrodes) 15 into which a driving current from the power line 133 is flowed, when electrically connected with the power line 133 via the driving TFT 11a, and a light-emitting functional layer E interposed between the anodes 15 and a cathode (common electrode) 19. Here, an element formed by the anodes 15, the cathode 19, and the light-emitting functional layer E is the organic EL element.

When the scanning lines 131 are driven and the switching TFTs 11b is in an ON state, an electric potential of the signal lines 132 is stored in the storage capacitor cap to determine ON or OFF state of the driving TFT 11a depending on the state of the storage capacitor cap. Therefore, a current is flowed from the power line 133 to the anode 15 via a channel of the driving TFT 11a, and the current is flowed to the cathode 19 through the light-emitting functional layer E. As a result, the light-emitting functional layer E emits light based on the amount of current flowed thereto.

As shown in FIG. 11, the organic EL device 400 including the circuit structure shown in FIG. 10 comprises pixel portions 3 having an approximately rectangular shape in a plan view (within a dashed line box in FIG. 11) in which the anodes connected to the switching TFTs (not shown) are arranged in a matrix on a substrate main body 10A having an electric insulation and a transmitting property. The pixel portions 3 are divided into a display region 4 (within a dashed line box in the pixel portions 3) of a central portion and a dummy region 5 arranged in the vicinity of the display region 4. In the display region 4, three colors display dots R, G, B each having an anode are arranged in a matrix to be spaced apart from each other in all directions. In this embodiment, the pixel regions 71 are formed at positions corresponding to each of the display dots.

Further, the scanning line driving circuits 73 are arranged at left and right sides of the display region 4 in FIG. 11, and the data line driving circuits 72 are arranged at upper and lower sides of the display region 4 in FIG. 11. The scanning lines driving circuits 73 and the data line driving circuits 72 are arranged in a peripheral portion of the dummy region 5. In addition, at an upper side of the data driving circuit 72 in FIG. 11, a test circuit 90 is arranged. The test circuit 90 is a circuit for inspecting operating conditions of the organic EL device 400. For example, the test circuit 90 comprises test information output means (not shown) that outputs inspection results to the outside. The test circuit 90 is constructed so as to inspect the quality and defects of an organic EL device during manufacture or at the time of shipment. Moreover, the test circuit 90 is also arranged below the dummy region 5. Further, a driving external substrate 51 including a flexible printed board is connected to the substrate main body 10A, and an external driving circuit 50 is mounted on the driving external substrate 51.

Next, referring to FIG. 12, the pixel structure of the organic EL device 400 according to this embodiment will be described. As shown in FIG. 12, in the organic EL device 400 according to this embodiment, the plurality of scanning lines 131 extending in the horizontal direction in the drawing, and the plurality of signal lines 132 and power lines 133 which extend parallel to each other in a direction orthogonal to the scanning lines 131 are arranged. A rectangular region in plan view surrounded by the scanning lines 131 which are parallel to each other, the signal lines 132 which extend in a direction orthogonal to the scanning lines 131, and the power lines 133 define the pixel region 71. The anodes 15 are provided in the respective pixel regions. A bank layer having opening in a position corresponding to the center portion of the anode 15 is provided on a surface of the substrate including the anode 15, a light-emitting functional layer E having the organic light-emitting layer is formed by being divided by the bank layer. Further, below the anodes 15 (viewer's side), one color filter 14 (14R, 14G, 14B) of the three primary colors is arranged corresponding to one of the pixel regions 71. The color filter 14 is divided by the bank layer, as same as the light-emitting functional layer E. That is, in a bank layer (bank layer for color filter) that divides the color filter 14, openings are formed at positions corresponding to the respective anodes 15. By being divided by the bank layer, color filters 14 having each of colors are provided in the center portion of the pixel region 71. The opening of the bank layer for color filter is larger than the opening of the bank layer (bank layer for light-emitting functional layer) for dividing the light-emitting functional layer E. The opening region of the bank layer for the light-emitting functional layer is formed inside the opening region of the bank layer for color filter in plan view. Therefore, in the organic EL device 400 of this embodiment, three pixel regions having different colors form one color pixel, which can display color images.

The switching TFTs 11b and the driving TFT 11a are interposed between the anodes 15 and the scanning lines 131, signal lines 132 and power lines 133. TFT 11b comprises a gate electrode portion 131a, a semiconductor layer (not shown) arranged so as to jump the gate electrode portion 131a in plan view, a source electrode portion 132a provided at one of both sides of the semiconductor layer, and a drain electrode portion 135 provided at another side of the semiconductor layer. In a region of the semiconductor layer that opposes to the gate electrode portion 131a, a channel region (an oblique hatched portion in FIG. 12) of TFT 11b is formed, a source region which is connected to a source electrode portion 132a and a drain region which is connected to a drain electrode portion 136 are formed in the semiconductor layers at both sides. The gate electrode portion 131a is formed so as to allow a part of the scanning line 131 be branched in a direction in which the signal line 132 extends, and faces the semiconductor layer with an insulating film (not shown) interposed therebetween at an edge thereof. The source electrode portion 132a is formed so as to allow a part of the signal line 132 be branched in a direction in which the scanning line 131 extends, and is electrically connected to the source region of the semiconductor layers via a contact hole (not shown) or directly.

TFT 11a comprises a gate electrode portion 135a, a semiconductor layer (not shown) arranged so as to jump the gate electrode portion 135a in plan view, a source electrode portion 133a provided at one of both sides of the semiconductor layer, and a drain electrode portion 136 provided at another side of the semiconductor layer. In a region of the semiconductor layer that opposes to the gate electrode portion 135a, a channel region (an oblique hatched portion in FIG. 12) of TFT 11a is formed, a source region which is connected to a source electrode portion 133a and a drain region which is connected to a drain electrode portion 135 are formed in the semiconductor layers at both sides. The gate electrode portion 135a is formed so as to allow a part of the drain electrode portion 135 of TFT 11b be branched in a direction in which a power line 133 extends, and faces the semiconductor layer with an insulating film (not shown) interposed therebetween at an edge thereof. The source electrode portions 133a are formed so as to allow a part of the power line 133 be branched in a direction in which the scanning line 131 (drain electrode portion 135) extends, and are electrically connected to the source region of the semiconductor layer via a contact hole (not shown) or directly. An end of the drain electrode portion 136 of TFT 11a is electrically connected to the drain region via a contact hole (not shown) or directly, and another end of the drain electrode portion 136 of TFT 11a is electrically connected to the anode 15 via a contact hole (not shown) or directly. Therefore, TFT 11a is in ON state during a predetermined period by a gate signal input via the scanning line 131 to output the signal supplied via the signal line 132 as a gate electrode signal at a predetermined timing. Further, TFT 11a is in ON state during a predetermined period by a gate signal input via the drain electrode portion 135 of TFT 11b to flow a driving current supplied via the power line 133 into a light-emitting functional layer E at a predetermined timing.

Hereinafter, the sectional structure of the organic EL device 400 will be described with reference to FIG. 13.

FIG. 13 is a sectional view (a sectional view of the pixel region 71 provided in a display region 4 in FIG. 11) along the line A-A' of FIG. 12. In the pixel region 71 of the organic EL device 400, a circuit element portion 11 having various wiring lines such as TFTs 11a, 11b, the scanning line 131, the signal line 132, or the power line 133 is provided on the transmissive substrate main body 10A such as glass. The color filter layer 13 is formed on the substrate main body 10A with an interlayer insulating film 12 therebetween which covers the circuit element portion 11. The color filter layer 13 comprises color filters having different colors from each other (red color filter 14R, green color filter 14G, and blue color filter 14B), and a light-shielding layer (black matrix) made of a black resin is arranged between the color filters 14R to 14B, if necessary. The bank layer 141 (bank layer for color filter) is arranged between the color filters, and a color filter 14 having a predetermined color is arranged in the pixel region 71 in a shape divided by the bank layer 141.

The organic EL elements P are formed on the color filter layer 13. The organic EL elements P have the light-emitting functional layer E provided in a divided region which is surrounded by the bank layer 16 (bank layer for light-emitting functional layer) provided on the substrate main body 10A, as a main body, and the light-emitting functional E is interposed between the anode 15 and the cathode 19. In the organic EL elements P, a plurality of functional layers (light-emitting functional layers E) having a light-emitting layer 18 are laminated in a region forming a flat surface in the planar region of the anode 15, and the cathode 19 which covers the bank layer 16 is formed on the functional layer. The light-emitting functional layer E having the plurality of functional layers covers the anode 15 to be formed inside the bank layer 16.

Since the organic EL device 400 of this embodiment is a bottom-emission type that emits light from the substrate main body 10A, the anode 15 is made of a transmissive conductive material such as ITO (indium tin oxide). The anode 15 is electrically connected to TFT 11a (drain electrode portion 136) of the circuit element portion 11 through a contact hole (not shown) which is formed in the interlayer insulating film 12. The cathode 19 is formed on the substrate main body 10A so as to cover the light-emitting functional layer E and the top face of the bank layer 16. The cathode 19 is preferably made of a metal material having a high reflectance, such as Al or Ag, or includes a structure of laminating a light-transmitting material and a metal material having a high reflectance, such as Al/ITO.

The light-emitting functional layer E has a hole injecting/transporting layer (charge transporting layer) 17 and the light-emitting layer 18, as a main body, and further has an electron-injecting layer or electron-transporting layer on the light-emitting layer 18, if necessary. As a material (hole injecting material) for forming the hole injecting/transporting layer 17, for example, a high molecular material such as polythiophene, polystyrenesulfonic acid, polypyrrole, polyaniline or derivatives thereof may be used. As a material (light-emmitting material) for forming the light-emitting layer 18, a well-known light-emitting material that is capable of emitting fluorescence or phosphorescence may be used. Specifically, a high molecular light-emitting substance such as a poly(paraphenylenevinylene) derivative, a polyphenylene derivative, a fluorene derivative, a polyvinylcarbazol derivative, or a polythiophene derivative, or a low molecular organic light-emitting pigment such as a perylene-based pigment, a coumarin-based pigment, or a rhodamine-based pigment may be suitably used. A material having an arylenevinylene or polxrfluorene structure in a conjugated polymer which is a light-emitting material is more preferable. It is possible to dope a material such as rubrene, perylene, 9,10-diphenylanthracene, tetraphenylbutadiene, nile red, coumarin 6, or quinacridone in the above material. Light emitting materials having different light-emitting colors from each other may be used for the light-emitting layers 18 in the respective pixel region of a red (R) pixel region, a green (G) pixel region, and a blue (B) pixel region. Particularly, in this embodiment, since the light-emitting layers are formed by using the liquid droplet ejection method, it is possible to easily spray the light-emitting material, compared to the case of using the evaporation method. However, if the light-emitting material changes, the effective life time of each color varies. Therefore, there are problems in that color balance of R, G, and B gradually deteriorates with an extended duration of use. For example, the effective life time of the red light-emitting material is longer than that of the green light-emitting material or the blue light-emitting material in the actual circumstances, but after an extended period of use, the display takes on a red tinge. Therefore, in this embodiment, the light-emitting layers 18 in the R, G, B pixel regions are formed with the same light-emitting material, which causes the effective life time for each color to be uniform. That is, the light-emitting layers 18 in the R, G, B pixel regions are made of a white-light-emitting material which emits white light, the colorization is performed by passing light radiated from the light-emitting layers (white-light-emitting layer) 18 through the color filter 14. In this regard, a material having an arylenevinylene or polyfluroene structure in a conjugated polymer which is a light-emitting material is more preferably used. Further, when the light-emitting layer 18 is formed by using the liquid droplet ejection method such as the inkjet method, a high molecular material is preferably used for the light-emitting material, for example, a material having a mixture of polydioctylfluorine (PFO) and MEH-PPV in a ratio of 9:1 is preferably used. Such white-light-emitting material has the effective life time longer than the blue light-emitting material or the green light-emitting material which is currently used, and is effectively used for display devices.

A sealing material 20 is formed on a upper layer of the cathode 19. As the sealing material 20, inorganic compounds, for example, silicon compounds such as silicon oxide, silicon nitride, or silicon oxynitride can be used. By covering the cathode 19 with the sealing material 20 made of an inorganic compound, it is possible to prevent effectively permeation of oxygen into the cathode 19 made of an inorganic compound. The sealing material 20 extends to the outer periphery of the substrate main body 10A in plan view, and the thickness thereof ranges from 10 nm to 300 nm. A protective film may be provided between the cathode 19 and the sealing material 20, if necessary.

The organic EL device 400 of this embodiment can be manufactured by the same method as the first embodiment. That is, the method of manufacturing the organic EL device 400 comprises (1) a color filter forming step, (2) an anode (pixel electrode) forming step, (3) a light-emitting functional layer forming step, and (4) a cathode (counter electrode) forming step and a sealing step. The step of forming a color filter 14 and the step of forming a light-emitting functional layer are performed by using the liquid droplet ejection method (inkjet method) in which a predetermined liquid material ejected from the liquid ejecting head is selectively disposed on the substrate. Since the description of (1) to (4) steps is similar to the first embodiment, the description will be omitted in here. Further, as the liquid ejecting head, it is possible to use a head using piezoelectric elements (piezo-elements). The above liquid ejecting head ejects ink (a liquid material including a light-emitting material or hole injecting material) reserved in the cavity from the eject nozzle which communicates with the cavity, by driving the piezoelectric elements (piezo-element) attached to the cavity to change the pressure in the cavity. As ejecting means of the ejecting head, an electromechanical converter which uses the piezoelectric elements, a method which uses an electrothermal converter as an energy generating element, a continuous method referred to as an electrification control type or a pressurized vibration type, an electrostatic suction method, and a method which irradiates an electromagnetic wave such as laser to heat the liquid material, and thus eject the liquid material by using the heat may be used therefor.

As described above, in this embodiment, the light-emitting layers 18 in each of the pixel regions are formed with the same light-emitting material, which causes the effective life time for each color to be uniform. As a result, it is possible to satisfactorily maintain the color balance in spite of the extended duration of use. In addition, since the light-emitting material is selectively provided only on a required region by using the liquid droplet ejection method, in this embodiment, it is possible to effectively utilize the expensive light-emitting material.

Figure 14:
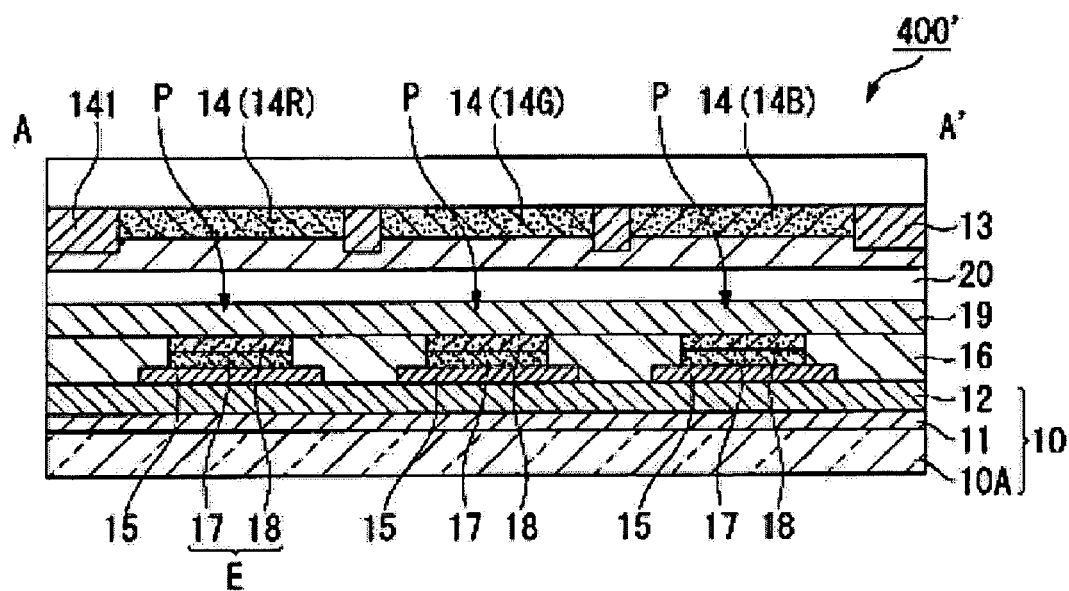
FIG. 14 is a cross-sectional schematic view viewing another structure.

The preferred embodiment according to the present invention has been explained with reference to FIGS. 10 to 13, but this invention is not limited to the above embodiments. The shape of the components or combination thereof which is described in the above embodiment is only an example, and various modifications may be made depending on the requirement without departing from the spirit and scope of the present invention. For example, in the present embodiment, the organic EL device 400 has been applied to the bottom-emission type, but the top-emission type can be adopted in that the color filters 14 are provided on an upper layer of the light-emitting layer 18 (an opposite side of the substrate main body 10A) by changing the material of the cathode 19, as like the second embodiment or the third embodiment. FIG. 14 is a schematic sectional view showing an example of the top-emission-type structure, which corresponds to FIG. 13. In the organic EL device 400' of FIG. 14, the transmissive conductive material such as ITO is used for the cathode 19. Further, in order that the light emitted to the substrate main body 10A can be transmitted through the cathode 19, the anode 15 may be made of the metal material having a high reflectance such as Al. It is also possible to make the anode 15 using the transmissive conductive material such as ITO, and to form separately the light reflecting film made of Al below the anode 15 (on the substrate main body 10A). The other structure is similar to that of FIG. 13.

Fifth Embodiment

Figure 15:
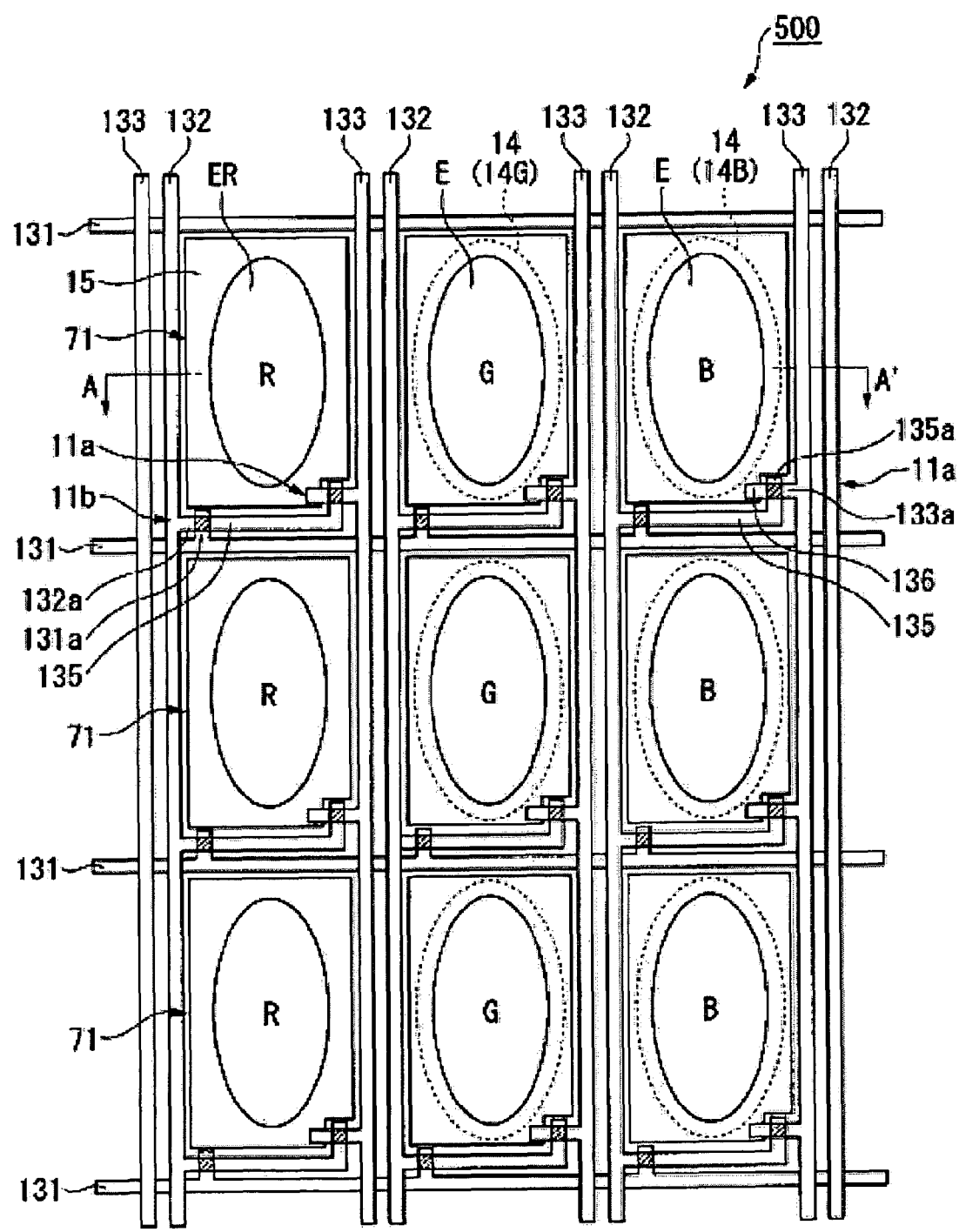
FIG. 15 is a schematic plan view showing a pixel structure of an organic EL device according to a fifth embodiment of the present invention.
Figure 16:
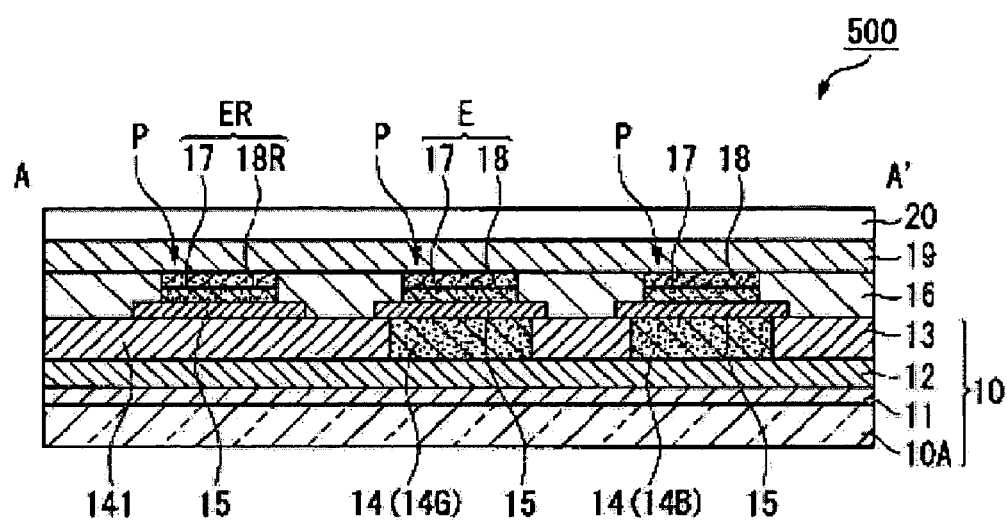
FIG. 16 is a schematic view showing a cross-section along the line A-A' of FIG. 15.

Next, referring to FIG. 15 and FIG. 16, an organic EL device according to a fifth embodiment will be described. FIG. 15 is an expanded schematic plan view showing a pixel structure of the organic EL device of this embodiment, and FIG. 16 is a schematic view showing a cross-section along the line A-A' of FIG. 15, which corresponds to FIG. 13 or FIG. 14. The basic structure of the organic EL device 500 of this embodiment is similar to that of the fourth embodiment, and is different from the fourth embodiment in that mainly, the light-emitting layer in the red pixel region is formed with a red light-emitting material, and the color filter 14R in the red pixel region is not provided. The same elements in FIG. 15 and FIG. 16 as those in FIGS. 10 to 14 are represented by the same reference numerals, and the description will be omitted.

As shown in FIG. 15, in the organic EL device 500 of this embodiment, on the surface of the substrate having the anodes 15, a bank layer having an opening in a position corresponding to the center portion of the respective anodes 15 is provided, a light-emitting functional layer E or light-emitting functional layer ER having an organic light-emitting layer is formed in the center portion of the pixel region 71, in a shape divided by the bank layer. In this embodiment, the light-emitting layer ER in the red pixel region is a color light-emitting layer, and is made of a red light-emitting material that emits a red light component which is a color light component. The light-emitting layers E in the green pixel region and the blue pixel region are made of a white-light-emitting material that emits a white light component. Further, below the anodes 15 (viewer's side), the green color filter 14G and the blue color filter 14B are arranged corresponding to the green pixel region and blue pixel region. The color filters 14 (14G, 14B) are divided by the bank layer, as same as the light-emitting functional layers E, ER. That is, in a bank layer (bank layer for color filter) that divides the color filter 14, openings are formed at positions of the green pixel region and blue pixel region corresponding to the center portion of the anodes 15. In a shape divided by the bank layer, the green color filter 14G and the blue color filter 14B are provided in the center portion of the green pixel region and the blue pixel region, respectively. The opening of the bank layer for color filter is larger than the opening of the bank layer (bank layer for light-emitting functional layer) for dividing the light-emitting functional layers E, ER. The opening region of the bank layer for the light-emitting functional layer is formed inside the opening region of the bank layer for color filter in plan view. Therefore, in the organic EL device 500 of this embodiment, three pixel regions having different colors form one color pixel, which can display color images.

Next, a sectional structure of the organic EL device 500 will be described with reference to FIG. 16.

FIG. 16 is a sectional view (a sectional view of the pixel region 71 provided in a display region 4 in FIG. 11) along the line A-A' of FIG. 15. In the pixel region 71 of the organic EL device 500, a circuit element portion 11 having various wiring lines such as TFTs 11*a*, 11*b*, the scanning line 131, the signal line 132, or the power line 133 is provided on the transmissive substrate main body 10A such as glass. The color filter layer 13 is formed on the substrate main body 10A with an interlayer insulating film 12 therebetween which covers the circuit element portion 11. The color filter layer 13 includes color filters having different colors from each other (green color filter 14G and blue color filter 14B), and a light-shielding layer (black matrix) made of a black resin is arranged between the color filters 14G and 14B, if necessary. The bank layer 141 (bank layer for color filter) is arranged between the color filters, and a color filter 14 having a predetermined color is arranged in the pixel region 71 in a shape divided by the bank layer 141.

The organic EL elements P are formed on the color filter layer 14. The organic EL elements P have the light-emitting functional layer E or the light-emitting functional layer ER provided in a divided region which is surrounded by the bank layer 16 (bank layer for light-emitting functional layer) provided on the substrate main body 10A, as a main body, and the light-emitting functional E or the light-emitting functional layer ER is interposed between the anode 15 and the cathode 19. In the organic EL elements P, a plurality of functional layers (light-emitting functional layers E or light-emitting functional layer ER) having a light-emitting layer 18 or a light-emitting layer 18R are laminated in a region forming a flat surface in the planar region of the anode 15, and the cathode 19 which covers the bank layer 16 is formed on the functional layer. The light-emitting functional layer E, ER having the plurality of functional layers covers the anode 15 to be formed inside the bank layer 16.

Since the organic EL device 500 of this embodiment is a bottom-emission type that emits light from the substrate main body 10A, the anode 15 is made of a transmissive conductive material such as ITO (indium tin oxide). The anode 15 is electrically connected to TFT 11*a* (drain electrode portion 136) of the circuit element portion 11 through a contact hole (not shown) which is formed in the interlayer insulating film 12. The cathode 19 is formed on the substrate main body 10A so as to cover the light-emitting functional layer E, ER and the top face of the bank layer 16. The cathode 19 is preferably made of a metal material having a high reflectance, such as Al or Ag, or includes a structure of laminating a light-transmitting material and a metal material having a high reflectance, such as Al/ITO.

The light-emitting functional layer E has a hole injecting/transporting layer (charge transporting layer) 17 and the light-emitting layer 18, as a main body, and further has an electron-injecting layer or electron-transporting layer on the light-emitting layer 18, if necessary. Similarly, the light-emitting functional layer ER has a hole injecting/transporting layer (charge transporting layer) 17 and the light-emitting layer 18R, as a main body, and further has an electron-injecting layer or an electron-transporting layer on the light-emitting layer 18R, if necessary. In this embodiment, the light-emitting layer (red light-emitting layer) 18R in the red pixel region is made of a red light-emitting material, and the rest light-emitting layers (white-light-emitting layer) 18 in the green pixel region and the blue pixel region are made of a white-light-emitting material. As mentioned above, there is a deviation in the effective life times of the red light-emitting material, the blue light-emitting material, and the green light-emitting material under the actual circumstances, especially, the blue light-emitting material and the green light-emitting material does not have an effective life time characteristic. Accordingly, in the above-mentioned first to fourth embodiments, all of the red pixel region, the blue pixel region, and the green pixel region are made of the same white-light-emitting material to make the life time to be uniform. However, since the red light-emitting material has an effective life time characteristic, there is no need for using the same light-emitting material for all of the R, G, B pixel regions. In this embodiment, with respect to the blue light-emitting material and the green light-emitting material having an insufficient life time characteristic, the white-light-emitting layer 18 is used in combination with the color filter 14. With respect to the red light-emitting material having a sufficient life time characteristic, only the red light-emitting layer 18 is used to realize the colorization. Therefore, it is possible to obtain an effective life time characteristic for R, G, and B. In addition, the above well-known material may be used for the material for forming the hole injecting/transporting layer 17 and the material for forming the light-emitting layer 18, 18R.

The sealing material 20 is formed on an upper layer of the cathode 19 the material, the shape, the size, and the forming area of the sealing material 20 are similar to the fourth embodiment.

The organic EL device 500 of this embodiment can be manufactured by the same method as the fourth embodiment. That is, the method of manufacturing the organic EL device 500 comprises (1) a color filter forming step, (2) an anode (pixel electrode) forming step, (3) a light-emitting functional layer forming step, and (4) a cathode (counter electrode) forming step and a sealing step. The step of forming a color filter 14 and the step of forming a light-emitting functional layer are performed by using the liquid droplet ejection method. Since the description of the steps is similar to the fourth embodiment, the description will be omitted in here.

As mentioned above, with respect to the blue and green having an insufficient life time characteristic, the white-light-emitting layer is used in combination with the color filter, but with respect to the red having a sufficient life time characteristic, only the red light-emitting layer, without using the color filter, is used to perform color display. Therefore, it is possible to obtain an effective life time characteristic for any of colors. Further, since there is no light component absorbed in the red color filter, it is possible to improve the usability of light, and reduce a driving current.

The preferred embodiment according to the present invention has been explained with reference to FIG. 15 and FIG. 16, but this invention is not limited to the above embodiments. The shape of the components or combination thereof which is described in the above embodiment is only an example, and various modifications may be made depending on the requirement without departing from the spirit and scope of the present invention. For example, in the present embodiment, the organic EL device 500 have been applied to the bottom-emission type, but the top-emission type can be adopted in that the color filters 14 are provided on an upper layer of the light-emitting layer 18 (an opposite side of the substrate main body 10A), as shown in FIG. 14, by changing the material of the cathode 19. In addition, in this embodiment, the color filter in the red pixel region is omitted, but the color filter can be included, and the color filter 14R may also be provided together with the red light-emitting layer 18R that emits red light component. In this case, in spite of light absorption for red, since the color purity is improved as much as an absorption amount, it is possible to obtain the effective color reproductivity.

Sixth Embodiment

Figure 17:
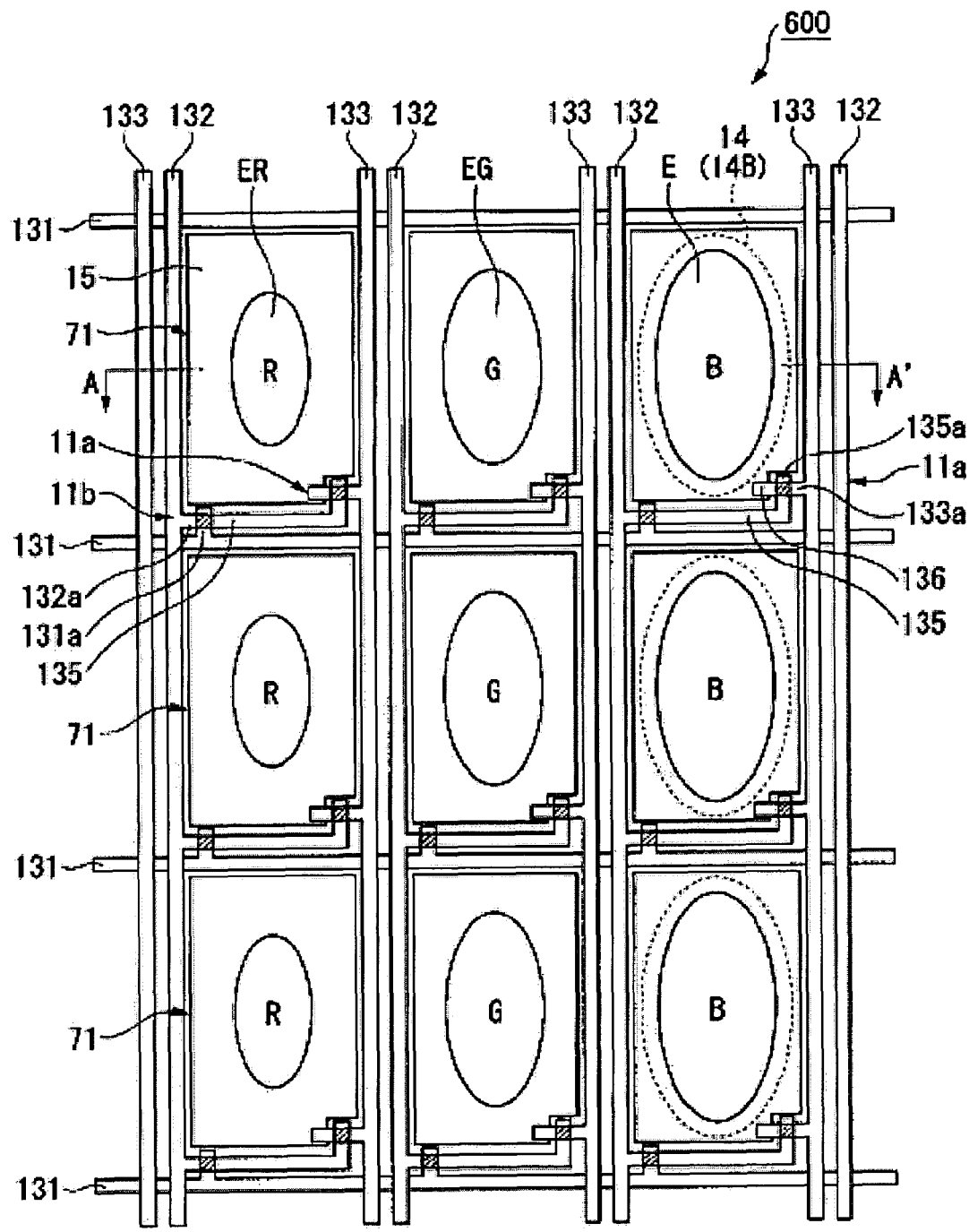
FIG. 17 is a schematic plan view showing a pixel structure of an organic EL device according to a sixth embodiment of the present invention.
Figure 18:
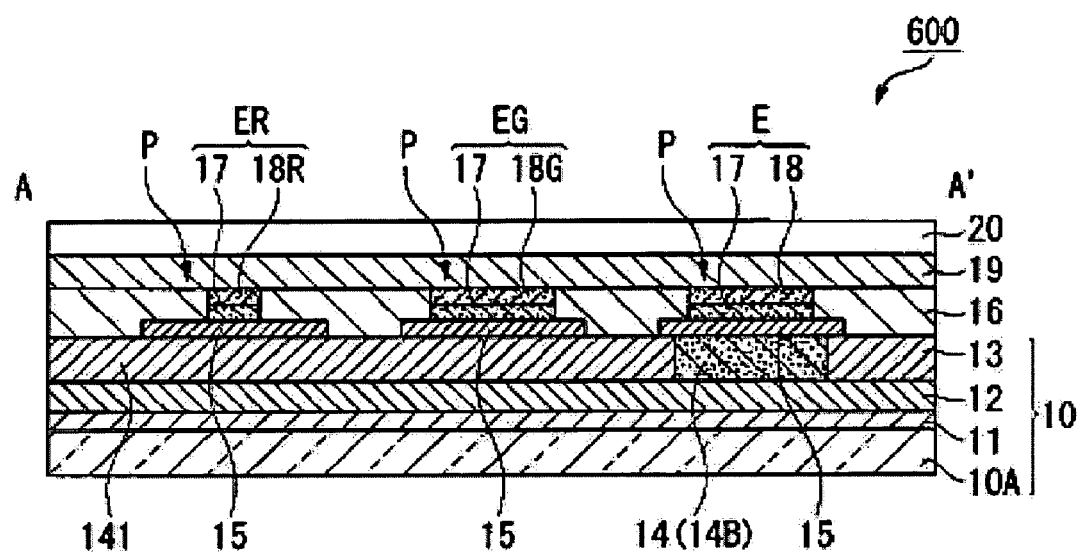
FIG. 18 is a schematic view showing a cross-section along the line A-A' of FIG. 17.

Next, referring to FIG. 17 and FIG. 18, an organic EL device according to a sixth embodiment will be described. FIG. 17 is an expanded schematic plan view showing a pixel structure of the organic EL device of this embodiment, and FIG. 18 is a schematic view showing a cross-section along the line A-A' of FIG. 17, which corresponds to FIG. 13 or FIG. 14. The basic structure of the organic EL device 600 of this embodiment is similar to that of the fourth embodiment, and is different from the fourth embodiment in that mainly, the light-emitting layers in the red pixel region and the green pixel region are formed with a red light-emitting material and a green light-emitting material, the color filters 14R, 14G in the red pixel region and the green pixel region are not provided, and the size of the red light-emitting layer, the green light-emitting layer, and the blue light-emitting layer is adjusted based on the light-emitting brightness for each color. The same elements in FIG. 17 and FIG. 18 as those in FIGS. 10 to 14 are represented by the same reference numerals, and the description will be omitted.

As shown in FIG. 17, in the organic EL device 600 of this embodiment, on the surface of the substrate having the anodes 15, a bank layer having an opening in a position corresponding to the center portion of the respective anodes 15 is provided, a light-emitting functional layer E or light-emitting functional layer ER or light-emitting functional layer EG having an organic light-emitting layer is formed in the center portion of the pixel region 71, in a shape divided by the bank layer. In this embodiment, the light-emitting layer ER in the red pixel region is a color light-emitting layer, and is made of a red light-emitting material that emits a red light component which is a color light component. The light-emitting layer EG in the green pixel region is a color light-emitting layer, and is made of a green light-emitting material that emits green light component which is color light component. To the contrary, the light-emitting layer E in the blue pixel region is a white-light-emitting layer, and is made of a white-light-emitting material that emits a white light component. Further, below the anodes 15 (viewer's side), the blue color filter 14B is arranged corresponding to the blue pixel region. The color filter 14 (14B) is divided by the bank layer, as same as the light-emitting functional layers E, ER, EG. That is, in a bank layer (bank layer for color filter) that divides the color filter 14, openings are formed at positions of the blue pixel region corresponding to the center portion of the anodes 15. In a shape divided by the bank layer, the blue color filter 14B is provided in the center portion of the blue pixel region. The opening of the bank layer for color filter is larger than the opening of the bank layer (bank layer for light-emitting functional layer) for dividing the light-emitting functional layers E, ER, EG. The opening region of the bank layer for the light-emitting functional layer is formed inside the opening region of the bank layer for color filter in plan view. Therefore, in the organic EL device 600 of this embodiment, three pixel regions having different colors form one color pixel, which can display color images.

Next, a sectional structure of the organic EL device 600 will be described with reference to FIG. 18.

FIG. 18 is a sectional view (a sectional view of the pixel region 71 provided in a display region 4 in FIG. 11) along the line A-A' of FIG. 17. In the pixel region 71 of the organic EL device 600, a circuit element portion 11 having various wiring lines such as TFTs 11a, 11b, the scanning line 131, the signal line 132, or the power line 133 is provided on the transmissive substrate main body 10A such as glass. The color filter layer 13 is formed on the substrate main body 10A with an interlayer insulating film 12 therebetween which covers the circuit element portion 11. The color filter layer 13 includes the blue color filter 14B, and a light-shielding layer 141 (black matrix) made of a black resin is arranged between the color filters 14B, if necessary. The bank layer 141 (bank layer for color filter) is arranged between the color filters, and a color filter 14 having a predetermined color is arranged in the pixel region 71 in a shape divided by the bank layer 141.

The organic EL elements P are formed on the color filter layer 14. The organic EL elements P have the light-emitting functional layer E or the light-emitting functional layer ER or the light-emitting functional layer EG provided in a divided region which is surrounded by the bank layer 16 (bank layer for light-emitting functional layer) provided on the substrate main body 10A, as a main body, and the light-emitting functional layer E or the light-emitting functional layer ER or the light-emitting functional layer EG is interposed between the anode 15 and the cathode 19. In the organic EL elements P, a plurality of functional layers (light-emitting functional layers E or light-emitting functional layer ER or the light-emitting functional layer ER) having a light-emitting layer 18 or a light-emitting layer 18R, 18G are laminated in a region forming a flat surface in the planar region of the anode 15, and the cathode 19 which covers the bank layer 16 is formed on the functional layer. The light-emitting functional layer E, ER, EG having the plurality of functional layers covers the anode 15 to be formed inside the bank layer 16.

Since the organic EL device 600 of this embodiment is a bottom-emission type that emits light from the substrate main body 10A, the anode 15 is made of a transmissive conductive material such as ITO (indium tin oxide). The anode 15 is electrically connected to TFT 11a (drain electrode portion 136) of the circuit element portion 11 through a contact hole (not shown) which is formed in the interlayer insulating film 12. The cathode 19 is formed on the substrate main body 10A so as to cover the light-emitting functional layer E, ER, EG and the top face of the bank layer 16. The cathode 19 is preferably made of a metal material having a high reflectance, such as Al or Ag, or includes a structure of laminating a light-transmitting material and a metal material having a high reflectance, such as Al/ITO.

The light-emitting functional layer E has a hole injecting/transporting layer (charge transporting layer) 17 and the light-emitting layer 18, as a main body, and further has an electron-injecting layer or electron-transporting layer on the light-emitting layer 18, if necessary. Similarly, the light-emitting functional layer ER has a hole injecting/transporting layer (charge transporting layer) 17 and the light-emitting layer 18R, as a main body, and further has an electron-injecting layer or electron-transporting layer on the light-emitting layer 18R, if necessary. The light-emitting functional layer EG has a hole injecting/transporting layer (charge transporting layer) 17 and the light-emitting layer 18G, as a main body, and further has an electron-injecting layer or electron-transporting layer on the light-emitting layer 18G, if necessary. In this embodiment, the light-emitting layer (red light-emitting layer) 18R in the red pixel region is made of a red light-emitting material, the green light-emitting layer (green light-emitting layer) 18G in the green pixel region is made of a green light-emitting material, and the rest light-emitting layer (white-light-emitting layer) 18 in the blue pixel region is made of a white-light-emitting material. As mentioned above, according to the fifth embodiment, with respect to red light-emitting material with a sufficient life time characteristic, color is displayed by using the red light-emitting layer made of the red light-emitting material, with respect to the green light-emitting material and the blue light-emitting material, the white-light-emitting layer is used in combination with the color filter. In this embodiment, between the green light-emitting material and the blue light-emitting material, the green light-emitting material which has more effective life time characteristic has the same structure as the red light-emitting material. In this embodiment, with respect to the blue light-emitting material having an insufficient life time characteristic, the white-light-emitting layer 18 is used in combination with the color filter 14. With respect to the red light-emitting material having a sufficient life time characteristic and the green light-emitting material with an appropriate life time characteristic, only the red light-emitting layer 18R and the green light-emitting layer 18G are used to realize the colorization. In this regard, according the above structure, since the brightness (in the case of blue pixel region, the brightness after light passes through the color filter 14B) or the life time is different between the red light-emitting layer 18R formed in the red pixel region, the green light-emitting layer 18G formed in the green pixel region, and the white-light-emitting layer 18 formed in the blue pixel region, the size of the light-emitting layer 18R, 18G, 18B is optimally adjusted in consideration of the above elements. Specifically, the size of the red light-emitting layer 18R with the largest brightness is set to be minimum, the size of the green light-emitting layer 18G with the intermediate brightness is set to be larger than that of the red light-emitting layer, and the size of the white-light-emitting layer 18 (the size after transmitting the color filter 14B) with the smallest brightness is set to be maximum. Therefore, it is possible to satisfactorily maintain the color balance of R, G, B. In addition, the above well-known material may be used for the material for forming the hole injecting/transporting layer 17 and the material for forming the light-emitting layer 18, 18R.

The sealing material 20 is formed on an upper layer of the cathode 19. the material, the shape, the size, and the forming area of the sealing material 20 are similar to the fourth embodiment.

The organic EL device 600 of this embodiment can be manufactured by the same method as the fourth embodiment. That is, the method of manufacturing the organic EL device 500 comprises (1) a color filter forming step, (2) an anode (pixel electrode) forming step, (3) a light-emitting functional layer forming step, and (4) a cathode (counter electrode) forming step and a sealing step. The step of forming a color filter 14 and the step of forming a light-emitting functional layer are performed by using the liquid droplet ejection method. Since the description of the steps is similar to the fourth embodiment, the description thereof will be omitted in here.

As mentioned above, with respect to the blue having an insufficient life time characteristic, the white-light-emitting layer 18 is used in combination with the color filter 14, but with respect to the red and green having a sufficient life time characteristic, only the red light-emitting layer or the green light-emitting layer without using the color filter is used to perform color display. Therefore, it is possible to obtain an effective life time characteristic for any of colors. Further, since there is no light component absorbed in the red color filter or the green color filter, it is possible to improve a light usability, and reduce a driving current.

The preferred embodiment according to the present invention has been explained with reference to FIG. 17 and FIG. 18, but this invention is not limited to the above embodiments. The shape of the components or combination thereof which is described in the above embodiment is only an example, and various modifications may be made depending on the requirement without departing from the spirit and scope of the present invention. For example, in the present embodiment, the organic EL device 600 has been applied to the bottom-emission type, but the top-emission type can be adopted in that the color filters 14 are provided on an upper layer of the light-emitting layer 18 (an opposite side of the substrate main body 10A), as shown in FIG. 14, by changing the material of the cathode 19. In addition, in this embodiment, the color filters in the red pixel region and the green pixel region are omitted, but the color filters can be included, and the red color filter 14R may be duplicatively provided with the red light-emitting layer 18R that emits a red light component or the green color filter 14G may be duplicatively provided with the green light-emitting layer 18G that emits a green light component. In this case, in spite of an absorption for a red light component or a green light component, since the color purity is improved as much as the absorption amount, it is possible to obtain an effective color reproductivity.

Further, in this embodiment, although the size of the light-emitting layer is adjusted in consideration of the duration of each color light-emitting layer, these consideration can be also applied to the fifth embodiment. That is, in the structure of the fifth embodiment, the brightness (in the case of the green pixel region and the blue pixel region, the brightness after light passes through the color filters 14G, 14B) or the life time is different between the red light-emitting layer 18R formed in the red pixel region and the white-light-emitting layer 18 formed in the green pixel region and the blue pixel region, an optimal adjustment of the size of the light-emitting layer 18R, 18G, 18B is needed. For example, it is possible to satisfactorily maintain the color balance of R, G, B by making the size of the red light-emitting layer 18R having the large brightness to be smaller than that of the white-light-emitting layer 18.

Figure 19:
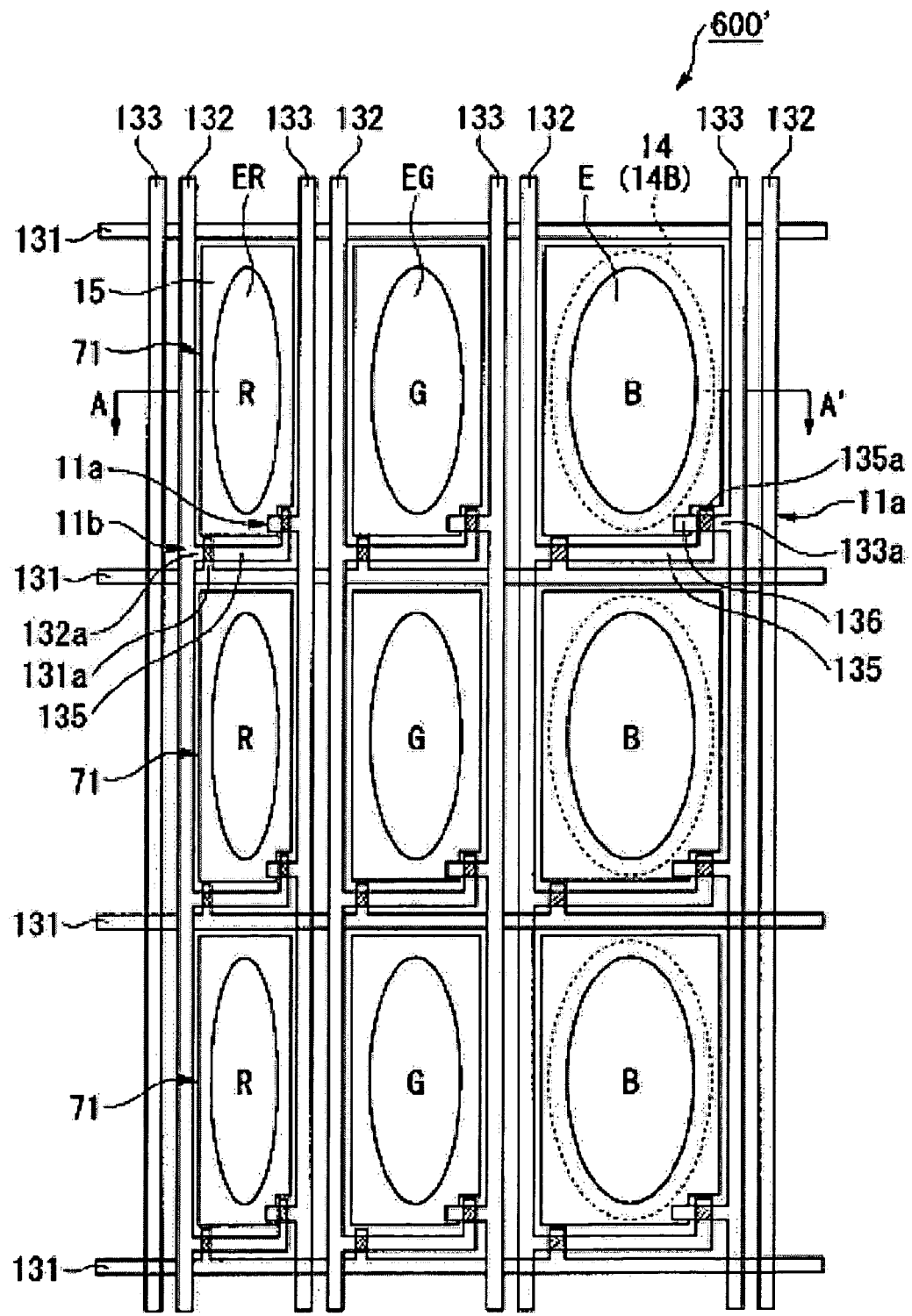
FIG. 19 is a schematic plan view showing another structure of the organic EL device.

In this embodiment, without changing the area of the R, G, B pixel regions, by only changing the ratio of an occupied area the light-emitting layer with respect to the pixel region, the color balance is adjusted, but this invention is not limited thereto. For example, as shown in FIG. 19, without changing the ratio of the occupied area of the light-emitting layer, by changing the size (for example, pitch) of the R, G, B pixel regions, the color balance may be adjusted. In the organic EL device 600' shown in FIG. 19, the ratio of the occupied area of the light-emitting layer with respect to the pixel region is equal to that of the R, G, B pixel regions, the pitches (width in a direction extending the scanning line 131) of the pixel regions gradually increase with respect to the R, G, B pixel regions, in this order. The other structure is similar to the above organic EL device 600. According to the above structure, while satisfactorily maintaining the brightness balance of R, G, B, it is possible to remarkably reduce the useless region which does not contribute to emit light (that is, in which the light-emitting layer does not provided).

Electronic Apparatus

Hereinafter, a specific example of the electronic apparatus comprising the above organic EL device will be described.

Figure 20:
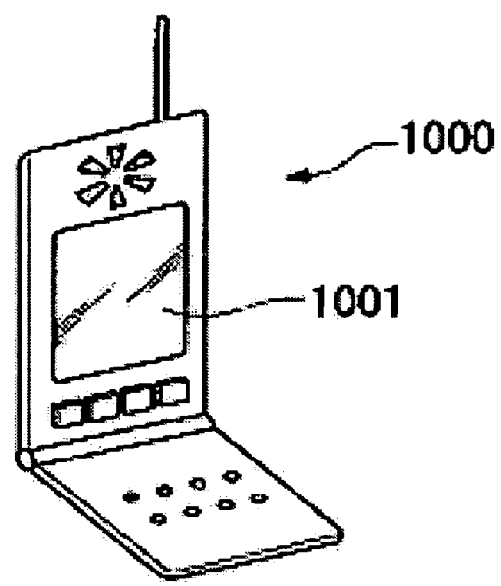
FIG. 20 is a perspective view showing an example of an electronic apparatus according to the present invention.

FIG. 20 is a perspective view showing an example of a mobile phone. In FIG. 20, the reference numeral 1000 refers to a main body of the mobile phone, the reference numeral 1001 refers to a display unit which uses the above organic EL device. By using the organic EL device of the above embodiment in the display unit of the electronic apparatus, it is possible to provide the electronic apparatus having a highly efficient display unit at a low cost.

The present invention is not limited to the above embodiments, and various modifications may be made without departing from the spirit and scope of the present invention. For example, the structure of the element substrate described in this embodiment is an example, it is also possible to adopt the other structures. Further, in these embodiments, the organic EL device of this invention is represented as an example of the display unit, this invention may be applied to the other application such as an organic EL device for a light source of the liquid crystal display device, or a light source used for an optical writing type laser printer and an optical communication.

What is claimed is:

1. A method of manufacturing an organic EL device comprising a plurality of first pixel electrodes, a plurality of second pixel electrodes, a counter electrode, a white-light-emitting layer for emitting white light components, a color light-emitting layer for emitting color light components, and color filters, comprising:

forming a first bank layer, the first bank layer having first openings that are formed at positions at which the white-light-emitting layer is arranged;

forming the color filters by ejecting a first liquid material containing a material for forming the color-light-emitting layer in the first openings by using a liquid droplet ejection method;

forming the plurality of first pixel electrodes and the plurality of second pixel electrodes, the plurality of first pixel electrodes on the color filters and the plurality of second pixel electrodes on the first bank at which the color-light-emitting layer is arranged;

forming a second bank layer, the second bank layer having second openings and third openings, the second openings are formed at positions at which the plurality of first pixel electrodes are arranged and the third openings are formed at positions at which the plurality of second pixel electrodes are arranged;

forming the white-light-emitting layer on the plurality of first pixel electrodes by ejecting a liquid material containing a material for forming the white-light-emitting layer in the second openings by using a liquid droplet ejection method;

forming the color-emitting-layer on the plurality of second pixel electrodes by ejecting a liquid material containing a material for forming the color-light-emitting layer in the third openings by using a liquid droplet ejection method; and forming the counter electrode on the second bank, white-light-emitting layer, and the color-light-emitting layer.

2. The method of manufacturing the organic EL device according to claim 1, an area of the second openings is larger than an area of the third opening.

* * * * *